(12) United States Patent
Cintuglu et al.

(10) Patent No.: US 11,327,123 B2
(45) Date of Patent: May 10, 2022

(54) DISTRIBUTION POWER SYSTEM FAULT CONTROL APPARATUS AND METHOD

(71) Applicant: Hitachi Energy Switzerland AG, Baden (CH)

(72) Inventors: Mehmet H. Cintuglu, Raleigh, NC (US); Dmitry Ishchenko, Cary, NC (US)

(73) Assignee: Hitachi Energy Switzerland AG, Baden (CH)

( * ) Notice: Subject to any disclaimer, the term of this patent is extended or adjusted under 35 U.S.C. 154(b) by 0 days.

(21) Appl. No.: 17/034,912

(22) Filed: Sep. 28, 2020

(65) Prior Publication Data
US 2022/0099754 A1    Mar. 31, 2022

(51) Int. Cl.
*G01R 31/40* (2020.01)
*H02J 3/00* (2006.01)

(52) U.S. Cl.
CPC .............. *G01R 31/40* (2013.01); *H02J 3/001* (2020.01)

(58) Field of Classification Search
CPC .......... G01R 31/40; G01R 31/42; H02J 3/001
USPC .................................................... 324/764.01
See application file for complete search history.

(56) References Cited

U.S. PATENT DOCUMENTS

| | | | |
|---|---|---|---|
| 9,537,301 B1* | 1/2017 | Schroeder | H02P 3/04 |
| 2015/0112496 A1* | 4/2015 | Fisher | H02J 3/16 |
| | | | 700/291 |
| 2016/0285269 A1 | 9/2016 | Majumder | |
| 2019/0363543 A1* | 11/2019 | Shariatzadeh | H02J 3/16 |

FOREIGN PATENT DOCUMENTS

| | | |
|---|---|---|
| CN | 107332251 A | 11/2017 |
| DE | 102018102220 A1 | 8/2019 |
| WO | 2012062323 A2 | 5/2012 |

OTHER PUBLICATIONS

IEEE Standards Ass'n, IEEE Std 1547-2018: Bulk System Opportunities from New Distributed Energy Resource Interconnection and Interoperability Standards (Jan. 8-9, 2019) (Year: 2019).*

Antonio Camacho et al., "Positive and Negative Sequence Control Strategies to Maximize the Voltage Support in Resistive-Inductive Grids During Grid Faults" IEEE Transactions on Power Electronics, vol. 33, No. 6, Jun. 2018, pp. 5362-5373.

(Continued)

*Primary Examiner* — Tung X Nguyen
*Assistant Examiner* — Robert P Alejnikov, Jr.
(74) *Attorney, Agent, or Firm* — Slater Matsil, LLP

(57) ABSTRACT

A method includes detecting a fault in a grid coupled to a distribution power network, the distribution power network comprising a distribution feeder, a plurality of distributed energy resources (DERs) coupled to the distribution feeder and a reference point of applicability (RPA) associated with the plurality of DERs, and in response to detecting the fault, determining an error voltage at the RPA, converting the error voltage into an error signal, broadcasting the error signal to the plurality of DERs, and based on the error signal, reducing the error voltage at the RPA by injecting a plurality of currents from the plurality of DERs to the distribution feeder.

23 Claims, 12 Drawing Sheets

802 — Detect a fault in a grid coupled to a distribution power network, the distribution power network comprising a distribution feeder, a plurality of distributed energy resources (DERs) coupled to the distribution feeder and a reference point of applicability (RPA) associated with the plurality of DERs 804 — In response to detecting the fault, determine an error voltage at the RPA, convert the error voltage into an error signal, broadcast the error signal to the plurality of DERs, and based on the error signal, reduce the error voltage at the RPA by injecting a plurality of currents from the plurality of DERs to the distribution feeder

(56) References Cited

OTHER PUBLICATIONS

IEEE Standards Association, "IEEE Standard for Interconnection and Interoperability of Distributed Energy Resources with Associated Electric Power Systems Interfaces" IEEE Std 1547-2018, 138 pages.

Monirul Islam et al., "A Grid-Support Strategy with PV units to Boost Short-term Voltage Stability under Asymmetrical Faults" IEEE Transactions on Power Systems, vol. 35, Iss. 2, Mar. 2020, 11 pages.

Jundi Jia et al., "A Review on Grid-Connected Converter Control for Short-Circuit Power Provision Under Grid Unbalanced Faults" IEEE Transactions on Power Delivery, vol. 33, No. 2, Apr. 2018, pp. 649-661.

Gustav Lammert et al., "Control of Photovoltaic Systems for Enhanced Short-Term Voltage Stability and Recovery" IEEE Transactions on Energy Conversion, vol. 34, No. 1, Mar. 2019, pp. 243-254.

Magesh Paramasivam et al., "Dynamic Optimization Based Reactive Power Planning to Mitigate Slow Voltage Recovery and Short Term Voltage Instability" IEEE Transactions on Power Systems, vol. 28, No. 4, Nov. 2013, pp. 3865-3873.

Pedro Rodriguez et al., "Decoupled Double Synchronous Reference Frame PLL for Power Converters Control" IEEE Transactions on Power Electronics, vol. 22, No. 2, Mar. 2007, pp. 584-592.

Prasanna Piya et al., "Fault Ride-Through Capability of Voltage-Controlled Inverters" IEEE Transactions on Industrial Electronics, vol. 65, No. 10, Oct. 2018, pp. 7933-7943.

P. Rodriguez et al., "New Positive-sequence Voltage Detector for Grid Synchronization of Power Converters under Faulty Grid Conditions" 2006 37th IEEE Power Electronics Specialists Conference, Jun. 18-22, 2006, 7 pages.

Masoud M. Shabestary et al., "Asymmetrical Ride-Through and Grid Support in Converter-Interfaced DG Units Under Unbalanced Conditions" IEEE Transactions on Industrial Electronics, vol. 66, No. 2, Feb. 2019, pp. 1130-1141.

Mahfuz A. Shuvra et al., "Distributed dynamic grid support using smart PV inverters during unbalanced grid faults" IET Renew. Power Gener., vol. 13, Iss. 4, 2019, pp. 598-608.

Seyed Fariborz Zarei et al., "Reinforcing Fault Ride Through Capability of Grid Forming Voltage Source Converters Using an Enhanced Voltage Control Scheme" IEEE Transactions on Power Delivery, vol. 34, No. 5, Oct. 2019, pp. 1827-1842.

\* cited by examiner

DISTRIBUTION POWER SYSTEM FAULT CONTROL APPARATUS AND METHOD

GOVERNMENT RIGHTS

This invention was made with U.S. Government support under Contract No. DE-OE0000896 awarded by the Department of Energy. The Government has certain rights in the invention.

TECHNICAL FIELD

The present invention relates generally to a fault control apparatus and method for controlling distributed energy resources in a distribution power system.

BACKGROUND

A power grid comprises conventional power stations such as coal-fired, gas and nuclear power plants and distributed energy resources (DERs). The conventional power stations are centralized and require electric energy to be transmitted over long distances. The DERs are small, modular, decentralized, grid-connected energy systems located in or near the loads where energy is consumed. The DERs and the loads form a distributed power network coupled to the power grid.

In operation, a fault may occur at the power grid. The grid fault can depress the voltage of the distribution power network and result in sensitive tripping of the DERs. The tripped DERs cause a massive loss of energy supply over a large geographic area. The unexpected energy supply loss in a short period of time may result in more complicated consequences such as overloading of the transmission line of the power grid and fault-induced delayed voltage recovery (FIDVR). FIDVR refers to an unexpected delay in the recovery of the voltage to its nominal value following the normal clearing of a fault. After the fault has been cleared, the voltage of the distribution power network remains at significantly reduced levels for several seconds, and then slowly returns to acceptable levels. To overcome such grid reliability concerns, DERs are required to implement fault ride-through functions.

Fault ride-though is one requirement aiming to prevent the DERs from entering into the trip mode so that the DERs are able to remain connected during the fault. The DERs are also required to participate in dynamic voltage support (DVS). Advanced DVS functions are now possible with the recent unprecedented advancements in flexible control of power converters of the DERs. However, efficient ways to take advantage of this flexibility in a coordinated manner is still an open research area. Thus, there is a need to improve the DVS control in the distribution power network so as to meet the requirements of the ever-changing power system.

SUMMARY

In accordance with an embodiment, a method comprises detecting a fault in a grid coupled to a distribution power network, the distribution power network comprising a distribution feeder, a plurality of distributed energy resources (DERs) coupled to the distribution feeder and a reference point of applicability (RPA) associated with the plurality of DERs, and in response to detecting the fault, determining an error voltage at the RPA, converting the error voltage into an error signal, broadcasting the error signal to the plurality of DERs, and based on the error signal, reducing the error voltage at the RPA by injecting a plurality of currents from the plurality of DERs to the distribution feeder.

In accordance with another embodiment, a system comprises a distribution power network coupled to a grid, the distribution power network comprising a distribution feeder, a plurality of distributed energy resources (DERs) coupled to the distribution feeder and a reference point of applicability (RPA), a RPA controller coupled to the RPA, the RPA controller being configured, by a program, to detect a fault in the grid, and in response to detecting the fault, determine an error voltage at the RPA and convert the error voltage into an error signal, a first communication device coupled to the RPA controller, the first communication device being configured to broadcast the error signal to the plurality of DERs, and a plurality of DER controllers coupled to respective DERs of the plurality of DERs, wherein based on the error signal, the plurality of DER controllers is configured by programming to control the respective DERs to reduce the error voltage at the RPA by injecting a plurality of currents to the distribution feeder.

In accordance with yet another embodiment, a reference point of applicability (RPA) controller comprises a control apparatus coupled to a distribution power network comprising a distribution feeder, a plurality of distributed energy resources (DERs) coupled to the distribution feeder and a RPA, wherein the control apparatus is directly coupled to the RPA, the control apparatus comprising a memory storing a program comprising instructions, a processor coupled to the memory and configured to execute the program, and a first communication device coupled to the processor, wherein the instructions when executed cause the processor to detect a fault in a grid coupled to the distribution power network, and in response to detecting the fault, determine an error voltage at the RPA, convert the error voltage into an error signal and send the error signal to the first communication device, and wherein the first communication device is configured to broadcast the error signal to the plurality of DERs.

In accordance with yet another embodiment, a distributed energy resources (DER) control system comprises a plurality of DER controllers coupled to a distribution power network comprising a distribution feeder, a plurality of distributed energy resources (DERs) coupled to the distribution feeder and a reference point of applicability (RPA), wherein each of the plurality of DER controllers is coupled to a corresponding DER of the plurality of DERs, each of the plurality of DER controllers comprising a memory storing a program comprising instructions, a processor coupled to the memory and configured to execute the program, and a communication device coupled to the processor, and wherein the instructions when executed in each of the plurality of DER controllers cause the plurality of DER controllers to receive an error signal from a RPA controller directly coupled to the RPA, send control signals to the plurality of DERs, one of the control signals being sent to one of the plurality of DERs, and wherein the control signals received by the plurality of DERs are configured to reduce an error voltage at the RPA by injecting a plurality of currents from the plurality of DERs to the distribution feeder.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely a fault control apparatus and method for controlling distributed energy resources in a distribution power system. The present disclosure may also be applied, however, to a variety of power systems. Hereinafter, various embodiments will be explained in detail with reference to the accompanying drawings.

Figure 1:
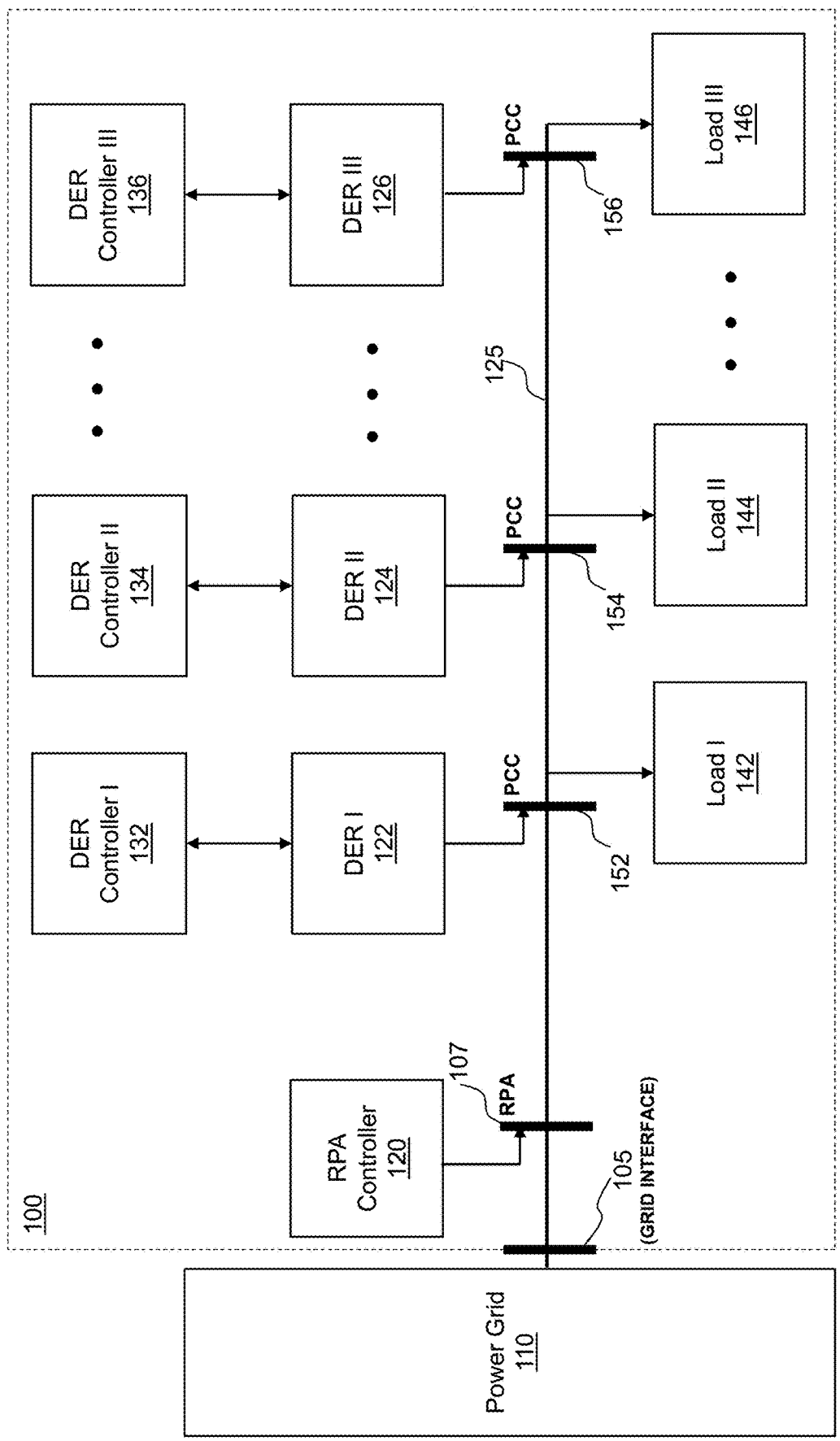
FIG. 1 illustrates a block diagram of a distribution power network in accordance with various embodiments of the present disclosure.

FIG. 1 illustrates a block diagram of a distribution power network in accordance with various embodiments of the present disclosure. A distribution power network 100 is coupled to a power grid 110. The distribution power network 100 comprises a distribution feeder 125. The distribution feeder 125 is a power distribution bus coupled to the grid 11o through a grid interface 105. The distribution power network 100 further comprises a plurality of distributed energy resources (DERs) 122, 124 and 126. In some embodiments, the DERs 122, 124 and 126 may be photovoltaic panels, battery energy storage systems, other suitable renewable energy sources and any combinations thereof.

The DERs 122, 124 and 126 are coupled to the distribution feeder 125. As shown in FIG. 1, each DER is connected to the distribution feeder 125 through a point of common connection (PCC). As shown in FIG. 1, the DER 122 is connected to the distribution feeder 125 through a PCC 152. The DER 124 is connected to the distribution feeder 125 through a PCC 154. The DER 126 is connected to the distribution feeder 125 through a PCC 156. The detailed structure and operating principle of the DERs will be described below with respect to FIG. 3. Each DER is equipped with a DER controller. As shown in FIG. 1, a DER controller 132 is coupled to the DER 122. A DER controller 134 is coupled to the DER 124. A DER controller 136 is coupled to the DER 126. The detailed structure and operating principle of the DER controller will be described below with respect to FIG. 6.

The distribution power network 100 further comprises a reference point of applicability (RPA) 107 and a RPA controller 120 coupled to the RPA 107. The RPA 107 is adjacent to the grid interface 105. The RPA controller 120 is configured to detect a fault in the power grid 110. In response to detecting the fault, the RPA controller 120 is configured to determine an error voltage at the RPA 107 and convert the error voltage into an error signal. The detailed structure and operating principle of the RPA controller 120 will be described below with respect to FIG. 5.

The distribution power network 100 further comprises a plurality of loads 142, 144 and 146 coupled to the distribution feeder 125. In some embodiments, the loads 142, 144 and 146 may be residential loads, rotating loads (e.g., induction motors) and any combinations thereof.

In operation, a fault such as an unbalanced fault may occur in the power grid 110. The RPA controller 120 is configured to determine an error voltage at the RPA, convert the error voltage into an error signal. At the RPA, the PRA controller 120 further separates positive sequence components of the error voltage from negative sequence components of the error voltage, and generates an error signal comprising a first component based on the positive sequence components, and a second component based on both the positive sequence components and the negative sequence components. The first component of the error signal comprises a value indicative of a magnitude boosting requirement of the distribution power network 100 during the fault.

The second component of the error signal comprises a value indicative of a voltage imbalance of the distribution power network 100 during the fault. In the context of the present invention, the first component may be a positive voltage sequence error and the second component may a negative voltage sequence error.

The RPA controller 120 broadcasts the error signal to the plurality of DERs. In particular, the RPA controller 120 broadcasts the error signal to the DERs directly coupled to the RPA through suitable communication links. The DERs directly coupled to the RPA forward the error signal to DERs indirectly coupled to the RPA.

In the distribution power network 100, based on the first component of the error signal, a voltage of the distribution power network is boosted by applying a positive sequence current injection control scheme to the plurality of DERs. Based on the second component of the error signal, the unbalanced voltages of the distribution power network may be mitigated by applying a negative sequence current injection control scheme to the plurality of DERs.

The fault is an unbalanced fault occurred in at least one phase of three phases of the grid. The phase where the fault occurs is a faulted phase. The phase where the fault does not occur is a non-faulted phase. A dynamic voltage support (DVS) control scheme is applied to the plurality of DERs for reducing the error voltage at the RPA. Applying the DVS control scheme comprises, by injecting a plurality of currents to the distribution feeder, boosting voltages of faulted phases of the plurality of DERs and mitigating unbalanced voltages of non-faulted phases of the plurality of DERs.

In the distribution power network, a distributed target tracking control scheme is applied to the plurality of DERs. Applying the distributed target tracking control scheme comprises determining the plurality of currents to be injected under the distributed target tracking control scheme by having communications between the DERs to coordinate a current to be injected by each of the plurality of DERs. Based on the error signal, the plurality of DERs is coordinated to inject currents into the distribution power network. This may be achieved by a velocity matching algorithm, e.g., by coordinating the plurality of DERs comprising aligning a current variation of one DER of the plurality of DERs with current variations of the remaining ones of the plurality of DERs. This may further be achieved by a flock-centering algorithm, e.g., by coordinating the plurality of DERs comprising aligning a voltage of one DER of the plurality of DERs with voltages of the remaining ones of the plurality of DERs.

Figure 2:
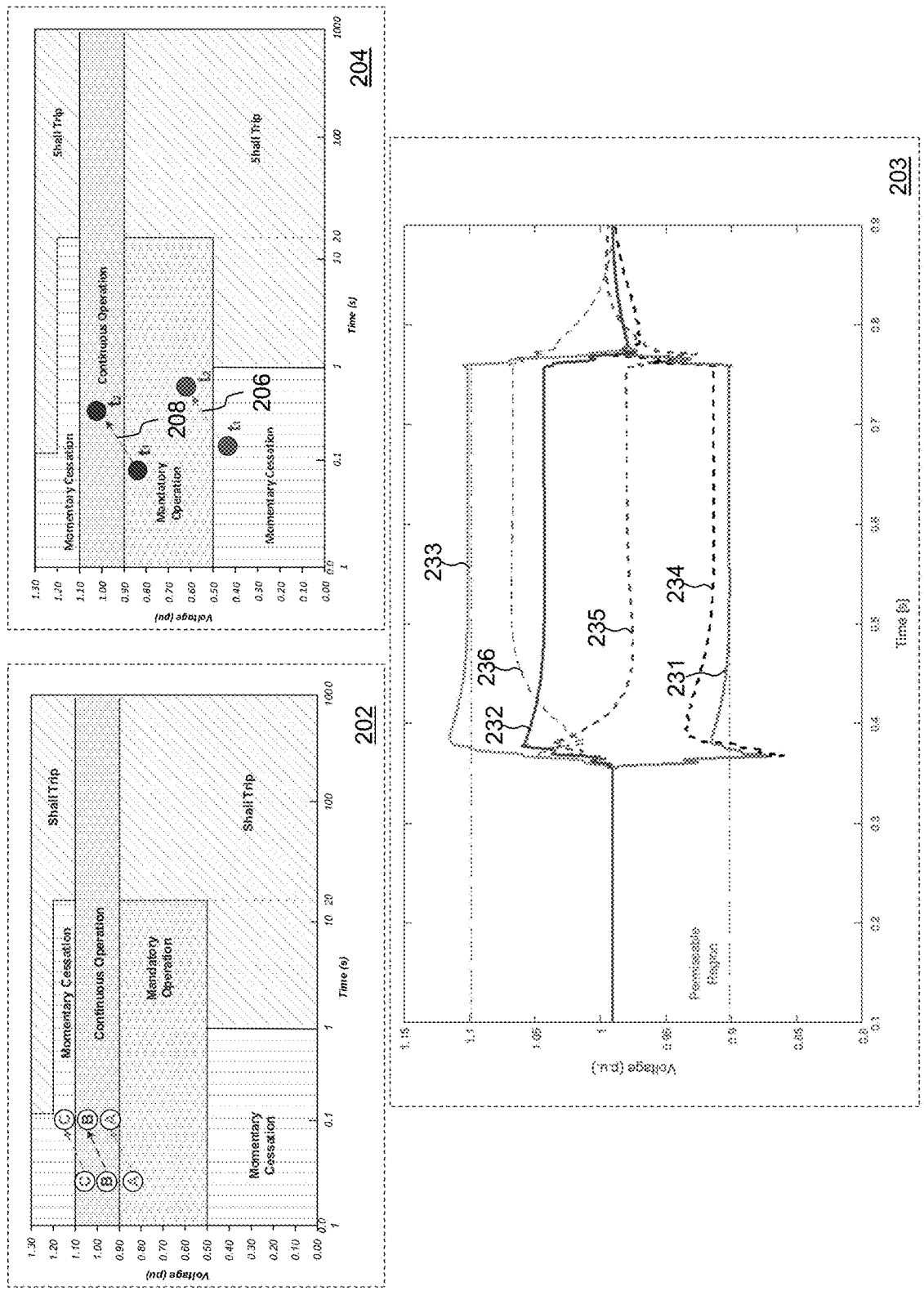
FIG. 2 illustrates under an unbalanced fault, DERs of the distribution power network are configured to operate in various operating modes in accordance with various embodiments of the present disclosure.

FIG. 2 illustrates under an unbalanced fault, DERs of the distribution power network are configured to operate in various operating modes in accordance with various embodiments of the present disclosure. A first operation chart 202 illustrates, under a conventional control scheme, DERs of the distribution power network operate in four different modes in response to a fault during a ride-through. A second operation chart 204 illustrates, under a control scheme of the present disclosure, DERs of the distribution power network operate in four different modes in response to a fault during a ride-through. A third operation chart 203 illustrates a comparison between the phase voltage response of the DERs under the conventional control scheme and the phase voltage response of the DERs under the control scheme of the present disclosure.

The horizontal axis of the first operation chart 202, the second operation chart 204 and the third operation chart 203 represents intervals of time. The unit is second. The vertical axis of the first operation chart 202, the second operation chart 204 and the third operation chart 203 represents voltages of a DER. The voltages are expressed in a per-unit system. The per-unit system is the expression of system quantities as fractions of a defined base unit quantity. The base value of the voltages is the rating voltage of an inverter coupled between the DER and the distribution feeder. The voltages of the DER may be alternatively referred to an applicable voltage.

As shown in the first operation chart 202 and the second operation chart 204, the DERs are designed to be able to operate in four different modes in response to abnormal voltage conditions (e.g., voltage perturbations after a fault occurs in the grid) during the ride-through. Each DER can be in one of four operating modes, namely a continuous operating mode, a mandatory operating mode, a momentary cessation mode and a trip mode. The trip mode may be alternatively referred to as a shall trip mode.

In the continuous operating mode, the DER remains in operation and continues delivering available active power of magnitude at least as great as its pre-disturbance level. The power delivered may be prorated by the per-unit voltage of the lease phase voltage if that voltage is less than nominal. In other words, the DER is in normal behavior while the applicable voltage is within specified limits (from 0.9 to 1.1 as shown in FIG. 2).

In the mandatory operating mode, within defined magnitude and duration limits, the DER is configured to withstand and support the grid until the voltage perturbations cease. As shown in FIG. 2, when the applicable voltage is from 0.5 to 0.9, within the duration limit of 20 seconds, the DER is configured to operate in the mandatory operating mode. The DER is capable of immediately returning to normal once the applicable voltage returns to the voltage range of the continuous operating mode. On the other hand, the DER may leave the mandatory operating mode and enter into the trip mode after the duration limit (20 seconds) expires.

In the momentary cessation mode, the DER temporarily ceases to energize the distribution power network. The DER is capable of immediately returning to normal once the applicable voltage returns to the voltage range of the continuous operating mode. On the other hand, the DER may enter into the trip mode after the duration limit expires. As shown in FIG. 2, when the applicable voltage is from 1.2 to 1.3, the duration limit is 0.1 seconds. Likewise, when the applicable voltage is from 1.1 to 1.2, the duration limit is 20 seconds. When the applicable voltage is from 0 to 0.5, the duration limit is 1 second.

In the trip operating mode, the DER ceases to energize distribution power network. Alternatively, the DER may be disconnected from the distribution power network.

In operation, an unbalanced fault occurs in at least one phase of three phases of the grid. For example, the fault occurs at phase A of the grid. As a result of having this fault, phase A is a faulted phase. The other two phases (phase B and phase C) are non-faulted phases. The first operation chart 202 illustrates, under a conventional control scheme, a phase of a DER may introduce overvoltage. In response to the fault, the voltages of the three phases of the DER are boosted through injecting currents into the distribution power network. The voltage of the faulted phase (phase A) is increased from about 0.8 to about 0.95. The voltage of one non-faulted phase (phase B) is increased from about 0.95 to about 1.05. The voltage of the other non-faulted phase (phase C) is increased from about 0.95 to about 1.15. Phase C introduces overvoltage and enters into the momentary cessation mode.

The second operation chart 204 illustrates, under the control scheme of the present disclosure, the three phases of the DER stay in either the mandatory operating mode or the continuous operating mode. In response to an unbalanced fault, a dynamic voltage support (DVS) control scheme is applied to the plurality of DERs. The plurality of DERs injects a plurality of currents to the distribution feeder for reducing the error voltage at the RPA. More particularly, by injecting the plurality of currents to the distribution feeder, the voltages of faulted phases of the plurality of DERs are boosted, and unbalanced voltages of non-faulted phases of the plurality of DERs may be mitigated. Boosting the voltages of the faulted phase and mitigating the unbalanced voltages of non-faulted phases will be further discussed below with respect to Equations (11)-(13).

As shown in FIG. 2, both the faulted phases and the non-faulted phases of the plurality of DERs are configured to operate in modes comprising the continuous operating mode, the mandatory operating mode, the momentary cessation mode and the trip mode as shown in the second operation chart 204. As indicated by the dashed line 206, boosting the voltages of the faulted phases of the plurality of DERs comprises forcing the faulted phases to leave the momentary cessation mode and enter into the mandatory operating mode. As indicated by the dashed line 208, mitigating the unbalanced voltages of the non-faulted phases of the plurality of DERs comprises forcing the non-faulted phases to leave the mandatory operating mode and enter into the continuous operating mode. Through boosting the voltages of the faulted phases of the plurality of DERs and mitigating the unbalanced voltages of the non-faulted phases of the plurality of DERs, the control scheme of the present disclosure may prevent the faulted phases and the non-faulted phases of the plurality of DERs from entering into the trip mode.

As shown in the second operation chart 204, one potentially advantageous feature of the control scheme of the present disclosure is mitigating the unbalanced voltages of the non-faulted phases of the plurality of DERs helps to reduce the possibility of introducing the overvoltage at the non-faulted phases, thereby reducing the overshoot risk.

The third operation chart 203 illustrates six voltage curves. A first curve 231 represents a voltage response of a faulted phase (e.g., phase A) after a fault occurs and the DERs are controlled under the conventional control scheme. A second curve 232 represents a voltage response of a non-faulted phase (e.g., phase B) after the fault occurs and the DERs are controlled under the conventional control scheme. A third curve 233 represents a voltage response of another non-faulted phase (e.g., phase C) after the fault occurs and the DERs are controlled under the conventional control scheme. A fourth curve 234 represents a voltage response of a faulted phase (e.g., phase A) after the fault occurs and the DERs are controlled under the control scheme of the present disclosure. A fifth curve 235 represents a voltage response of a non-faulted phase (e.g., phase B) after the fault occurs and the DERs are controlled under the control scheme of the present disclosure. A sixth curve 236 represents a voltage response of another non-faulted phase (e.g., phase C) after the fault occurs and the DERs are controlled under the control scheme of the present disclosure. As shown in FIG. 2, under the conventional control scheme, the voltage of one non-faulted phase (e.g., phase C) increases up to 1.1. As shown in the first operation chart 202, phase C leaves the continuous operating mode and enters into the mandatory cessation mode. By contrast, under the control scheme of the present disclosure, the voltages of the non-faulted phases (e.g., phase C and phase B) are less than 1.1. Furthermore, the fourth curve 234 and the first curve 231 indicate the recovery speed of the faulted phase under the control scheme of the present disclosure is faster than that of that under the conventional control scheme.

Figure 3:
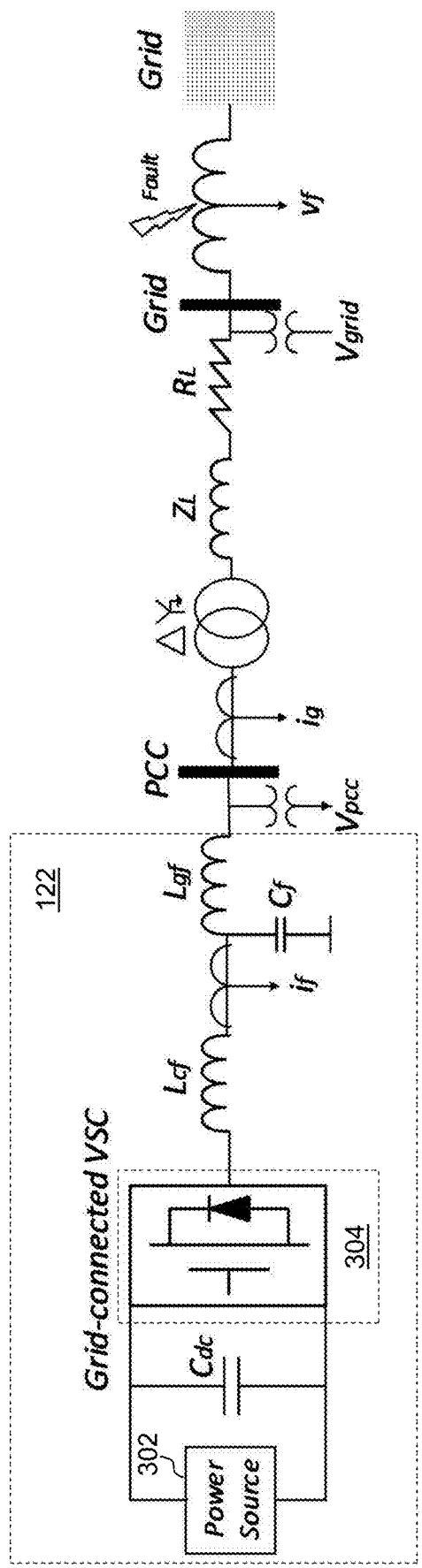
FIG. 3 illustrates a simplified model of the DER and the distribution feeder shown in FIG. 1 in accordance with various embodiments of the present disclosure.

FIG. 3 illustrates a simplified model of the DER and the distribution feeder shown in FIG. 1 in accordance with various embodiments of the present disclosure. The DER 122 comprises a power source 302, an output capacitor Cdc, a grid-connected voltage source converter (VSC) and an LCL filter. The power source 302 may be implemented as a PV panel. The grid-connected VSC may be implemented as an inverter. The LCL filter comprises a first inductor Lcf, a capacitor Cf and a second inductor Lgf. The DER 122 is connected to the distribution power network at a PCC. The distribution feeder is modelled as a series resistance $R_L$ and a series impedance $Z_L$. A wye-delta transformer is placed between the PCC and the distribution feeder. A PCC voltage sensor is employed to detect the voltage of the PCC ($V_{PCC}$). A current sensor is employed to detect the current flowing through the distribution feeder ($i_g$). A grid voltage sensor is employed to detect the voltage of the grind ($V_{grid}$).

In operation, when an unbalanced fault occurs in the grid, positive, negative and zero sequence components prevail. Depending on the fault type, resulting voltage magnitudes might be different. For instance, during a 2L-G fault, no significant voltage effect is observed on the non-faulted phase. If voltage support is enabled by only the positive sequence with an intention to support the faulted phase, the magnitude of the non-faulted phase magnitude would exceed a predetermined threshold. To avoid such consequences, the voltage support may incorporate positive and negative sequence support at the same time.

In FIG. 3, the mathematical relationship between the PCC ($V_{PCC}$) and the grid voltage ($V_G$) is:

$$V_{PCC} = V_G + Ri + L\frac{di}{dt} \tag{1}$$

In Equation (1), R is the equivalent resistance of the distribution feeder. L is the equivalent inductance of the distribution feeder.

This power converter (e.g., VSC 304) is capable of injecting both positive ($I^+$) and negative ($I^-$) sequence currents. By using the magnitudes of symmetrical components, positive and negative sequence information can be represented as:

$$V_{PCC}^+ = V_G^+ + RI^+ + \omega L I^+ \tag{2.1}$$

$$V_{PCC}^- = V_G^- + RI^- - \omega L I^- \tag{2.1}$$

Equations (2.1) and (2.2) can be rewritten based on the impedance of the distribution power network. If the network impedance is highly inductive, the resistive part of the equation can be neglected. Equations (2.1) and (2.2) can be rewritten as:

$$V_{PCC}^+ = V_G^+ + \omega L I^+ \tag{3.1}$$

$$V_{PCC}^- = V_G^- - \omega L I^- \tag{3.2}$$

Equations (3.1) and (3.2) suggest that positive sequence voltage can be boosted by injecting the positive-sequence reactive current on an inductive impedance dominated grid. On the other hand, injecting the negative sequence reactive current can help to mitigate the voltage unbalance. Equations (3.1) and (3.2) indicate the grid voltage support can be realized in two ways. If only positive sequence reactive power is injected under an unbalanced fault, the PCC voltage will be boosted equally in each phase compared to the grid voltage. The unbalanced voltages at the PCC can be compensated by injecting negative sequence reactive power.

Unbalance mitigation can be achieved by reducing the voltage magnitude gap between faulted and non-faulted phases. As a result of mitigating the unbalanced voltages, the non-faulted phases can avoid voltage overshoots.

Equations (2.1) and (2.2) can be also rewritten for low voltage grids as the grid impedance is more resistive. The equations can be rewritten by neglecting the inductive element. Equations (2.1) and (2.2) can be rewritten as:

$$V_{PCC}^+ = V_G^+ + RI^+ \quad (4.1)$$

$$V_{PCC}^- = V_G^- + RI^- \quad (3.2)$$

Equations (4.1) and (4.2) suggest that injecting positive sequence active power can boost the positive sequence voltage at the PCC while reducing the amount of negative sequence active power helps to mitigate the PCC voltage unbalance for the resistive network.

To control power converters (e.g., VSC 304) during unbalanced conditions, Equation (1) can be represented in the double synchronous reference frame (DSRF). In the stationary reference frame ($\alpha\beta$), Equation (1) can be expressed as:

$$V_{PCC_{\alpha\beta}} = V_{G_{\alpha\beta}} + Ri_{\alpha\beta} + L\frac{di_{\alpha\beta}}{dt} \quad (5)$$

During an unbalance fault, a voltage variable (V) in the stationary reference frame ($\alpha\beta$) can be decomposed into positive and negative sequence components in (dq) frame:

$$V_{\alpha\beta} = e^{j\omega t}V_{dq}^+ + e^{-j\omega t}V_{dq}^- \quad (6)$$

In Equation (6), $V_{\alpha\beta}$ is calculated from abc natural quantities of V as:

$$V_{\alpha\beta} = v_a e^{j0} + v_b e^{j3\pi/3} + v_c e^{-j2\pi/3} \quad (7)$$

The decomposed sequence models in (dq) frame can be obtained by substituting (6) into (5):

$$V_{d_{pcc}}^+ - V_{d_{Grid}}^+ = (R_f + sL_f)I_{d_{pcc}}^+ - \omega L_f I_{q_{pcc}}^+ \quad (8.1)$$

$$V_{q_{pcc}}^+ - V_{q_{Grid}}^+ = (R_f + sL_f)I_{q_{pcc}}^+ + \omega L_f I_{d_{pcc}}^+ \quad (8.2)$$

$$V_{d_{pcc}}^- - V_{d_{Grid}}^- = (R_f + sL_f)I_{d_{pcc}}^- + \omega L_f I_{q_{pcc}}^- \quad (9.1)$$

$$V_{q_{pcc}}^- - V_{q_{Grid}}^- = (R_f + sL_f)I_{q_{pcc}}^- - \omega L_f I_{d_{pcc}}^- \quad (9.2)$$

In Equations (8.1), (8.2), (9.1) and (9.2), Lf is the equivalence inductance of the distribution feeder. Rf is the equivalence resistance of the distribution feeder. For conditions that $L_f \gg R_f$, positive sequence magnitude boosting and negative sequence unbalance mitigation can be handled directly by controlling $I_{q_{pcc}}^+$ and $I_{q_{pcc}}^-$, respectively. On the other hand, $I_{d_{pcc}}^+$ can be generated to satisfy the active power delivery requirements according to converter current limits.

In this disclosure, a two-dimensional positive sequence magnitude boosting and negative sequence unbalance mitigation objective is handled by controlling $I_{q_{pcc}}^+$ and $I_{q_{pcc}}^-$ quantities for coordinating the positive sequence current injection for voltage magnitude boosting and coordinating negative sequence current injection for unbalance voltage mitigation. To realize appropriate power converter control, a phase locked loop (PLL) algorithm is employed to control the positive and negative sequence components independently.

A decoupled double synchronous reference frame PLL (DDSRF-PLL) control scheme is used to control the positive and negative sequence components independently. The DDSRF-PLL is known in the art, hence is not discussed in detail. After the DDSRF-PLL control scheme is applied, the control equations of the power converters (e.g., VSC 304) can be expressed as:

$$V_{d_{pcc}}^+ = V_{d_{Grid}}^+ - \omega L_f I_{q_{pcc}}^+ + PIx(I_{d_{ref}}^+ - I_{d_{pcc}}^+) \quad (10.1)$$

$$V_{q_{pcc}}^+ = V_{q_{Grid}}^+ + \omega L_f I_{d_{pcc}}^+ + PIx(I_{q_{ref}}^+ - I_{q_{pcc}}^+) \quad (10.2)$$

$$V_{d_{pcc}}^- = V_{d_{Grid}}^- + \omega L_f I_{q_{pcc}}^- + PIx(I_{d_{ref}}^- - I_{d_{pcc}}^-) \quad (10.3)$$

$$V_{q_{pcc}}^- = V_{q_{Grid}}^- - \omega L_f I_{d_{pcc}}^- + PIx(I_{q_{ref}}^- - I_{q_{pcc}}^-) \quad (10.4)$$

The control equations above are used to control the power converter. The control equations may be implemented in a DER controller. The detailed implementation of the control equations above will be described below with respect to FIG. 4.

After a fault occurs in the grid, the ride through requirement includes a two-dimensional unbalanced voltage recovery scheme. A first aspect of this two-dimensional unbalanced voltage recovery scheme is coordinating the positive sequence current injection for voltage magnitude boosting. A second aspect of this two-dimensional unbalanced voltage recovery scheme is coordinating the negative sequence current injection for voltage unbalance mitigation. The requirement at the RPA is broadcasted to the distribution power network though an error signal. Each of the power converters (e.g., VSC 304) can interpret this error signal, cooperate with other DERs and generate an incremental current injection locally over a time frame. The voltage change at the RPA can be expressed as:

$$\Delta v^{+,-} = \Delta i_Q^{+,-} \cdot t \quad (11)$$

Based on Equations (8.1), (8.2), (9.1) and (9.2) above, $\Delta i_Q$ of Equation (11) can be represented as $I_{q_{pcc}}^+$ and $I_{q_{pcc}}^-$, which function as current references for the power converters. It should be noted that $\Delta i_Q$ of Equation (11) only includes $I_q$. The path of the distribution power network is an inductive path. The reactive power is able to boost the voltage of the faulted phases. As such, the current $I_d$ can be ignored. It should further be noted that if the distribution power network has a resistive path, the active power is able to boost the voltage of the faulted phases. $I_q$ should be replaced by $I_d$. Furthermore, if the path has a combination of the resistive element and the inductive element, both $I_q$ and $I_d$ should be included.

The error signal broadcasted by the RPA includes a first component and a second component. The first component comprises a value indicative of a magnitude boosting requirement of the distribution power network during the fault. The second component comprises a value indicative of a voltage imbalance of the distribution power network during the fault. The first component can be expressed as:

$$\varepsilon_{mag} = \Delta v^+ = \frac{V_{RPA}^+}{V_{RPA}} \quad (12)$$

At the RPA, the positive sequence component ($V_{RPA}^+$) of the RPA voltage ($V_{RPA}$) is separated from the negative sequence components ($V_{RPA}^-$) of the RPA voltage. Equation

(12) indicates the first component of the error signal is based on the positive sequence component of the RPA voltage.

The second component of the error signal can be expresses as:

$$\varepsilon_{unbalance} = \Delta v^- = \frac{V_{RPA}^-}{V_{RPA}^+} \quad (13)$$

Equation (13) indicates that the second component of the error signal is based on both the positive sequence component and the negative sequence component of the RPA voltage.

The RPA broadcasts the error signals shown in Equations (12) and (13) to the DERs of the distribution power network. The broadcasted error signals are used by the DERs to generate current references for controlling respective power converters.

Figure 4:
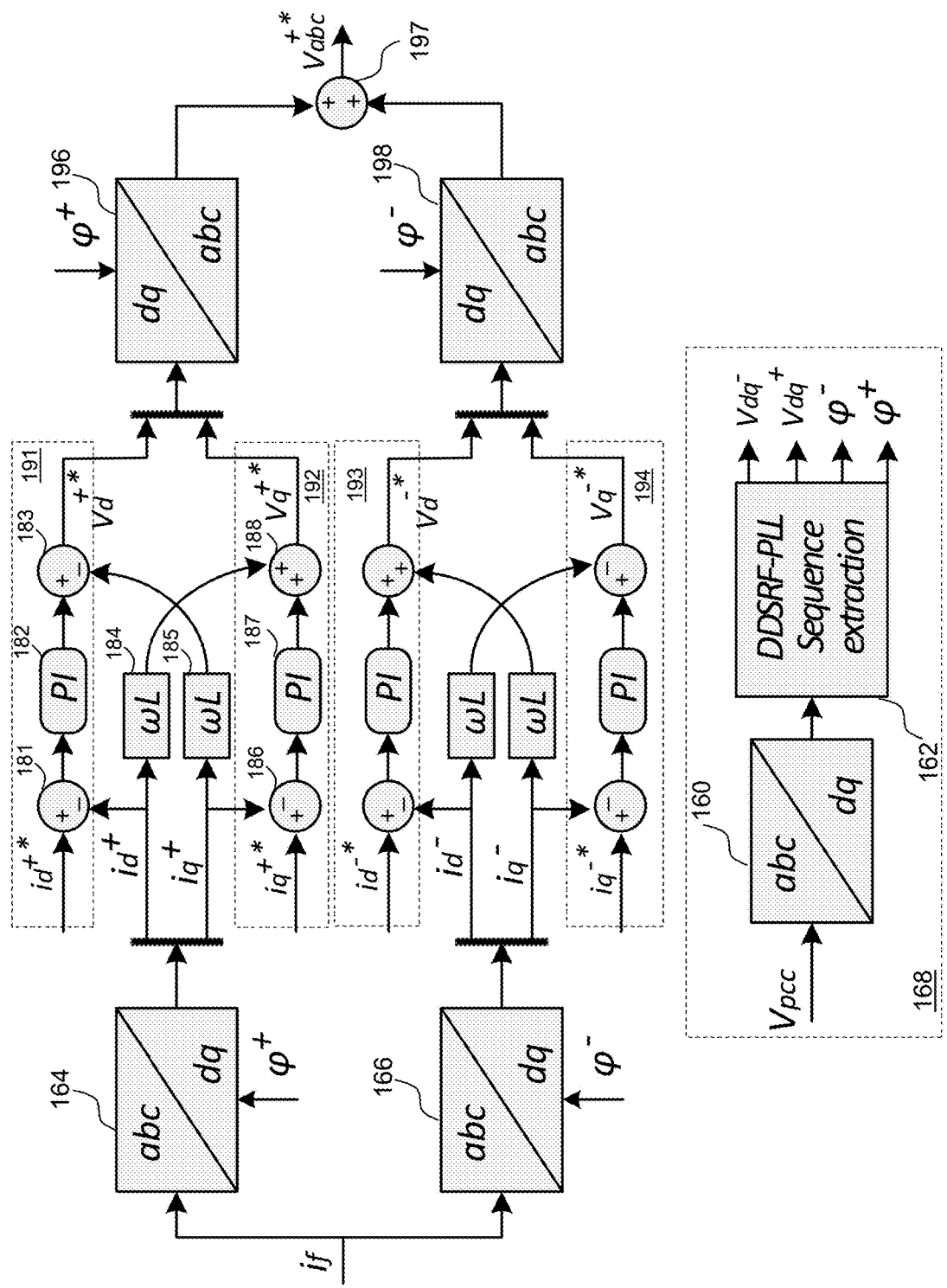
FIG. 4 illustrates a control system implementing a decoupled double synchronous reference frame PLL (DDSRF-PLL) control scheme in accordance with various embodiments of the present disclosure.

FIG. 4 illustrates a control system implementing a decoupled double synchronous reference frame PLL control scheme in accordance with various embodiments of the present disclosure. The control equations shown in Equations (10.1), (10.2), (10.3) and (10.4) are implemented in each DER controller. For simplicity, only a relevant portion of a DER controller is shown in FIG. 4. The DER controller is configured to receive the error signal broadcasted by the RPA and generate current references based on the error signal. The DER controller also receives the operating parameters (e.g., current and voltage of the inverter coupled to the DER controller). The DDSRF-PLL control scheme is employed to process the current references and the detected operating parameters, and generate control signals for controlling the current injection of the inverter.

The DER controller shown in FIG. 4 includes a voltage transformation section 168. In the voltage transformation section 168, three phase measured voltages are provided to a first transformation block 16o which transforms the three phase signals (lines abc) of $V_{PCC}$ to their corresponding signals in a dq synchronous reference frame, as is understood in the art.

The dq voltage signals are provided to a DDSRF-PLL sequence extraction block 162 where positive sequence dq voltages $V_{dq}^+$ and negative dq voltages $V_{dq}^-$ are computed. The positive sequence dq voltages $V_{dq}^+$ include the positive sequence direct and quadrature voltage components, $V_d^+$ and $V_q^+$, respectively. The negative sequence dq voltages $V_{dq}^-$ include the negative sequence direct and quadrature voltage components, $V_d^-$ and $V_q^-$, respectively. Furthermore, the DDSRF-PLL sequence extraction block 162 is configured to generate $\varphi^+$ and $\varphi^-$ signals. $\varphi^+$ and $\varphi^-$ signals represent the positive sequence and negative sequence phase angles of the voltage $V_{PCC}$, respectively.

Measured currents ($i_f$) of the inverter are provided to a second transformation block 164 and a third transformation block 166, respectively. Based on the measured currents and the positive sequence phase angle $\varphi^+$, the second transformation block 164 is configured to generate positive sequence dq currents $i_{dq}^+$. The positive sequence dq currents $i_{dq}^+$ include the positive sequence direct and quadrature current components, $i_d^+$ and $i_q^+$, respectively. Based on the measured currents and the negative sequence phase angle $\varphi^-$, the third transformation block 166 is configured to generate negative sequence dq currents $i_{dq}^+$. The negative sequence dq currents $i_{dq}^-$ include the negative sequence direct and quadrature current components, $i_d^+$ and $i_d^-$, respectively.

As shown in FIG. 4, the controller comprises four current processing branches, namely a positive sequence direct current processing branch 191, a positive sequence quadrature current processing branch 192, a negative sequence direct current processing branch 193 and a negative sequence quadrature current processing branch 194.

In the positive sequence direct current processing branch 191, the positive sequence direct current $i_d^+$ is fed into a summing unit 181. The summing unit 181 computes a difference between a positive sequence direct reference current $i_d^{+*}$ and the positive sequence direct current $i_d^+$. The difference may be alternatively referred to as a positive sequence direct current error. It should be noted the positive sequence direct reference current $i_d^{+*}$ is generated based on the error signal broadcasted by the RPA.

As shown in FIG. 4, the positive sequence direct current error is fed into a proportional-integral (PI) controller 182. The output of the PI controller 182 is generated based on the sum of the current error value and on an integral of the current error value. The PI control is well known in the art, and hence is not discussed. The output of the PI controller 182 is fed into a summing unit 183. As shown in FIG. 4, the summing unit 183 also receives a first cross-coupled signal which will be described below.

The first cross-coupled signal received by the summing unit 183 is generated as follows. The positive sequence quadrature current $i_q^+$ is fed into a multiplier 185 where it is multiplied by $\omega L$. The output of the multiplier 185 is equal to $i_q^+ \times \omega L$. The output of the multiplier 185, as a first cross-coupled signal, is provided to the summing unit 183. The summing unit 183 generates a positive sequence direct reference voltage $V_d^{+*}$.

In the positive sequence quadrature current processing branch 192, the positive sequence quadrature current $i_q^+$ is fed into a summing unit 186. The summing unit 186 computes a difference between a positive sequence quadrature reference current $i_q^{+*}$ and the positive sequence quadrature current $i_q^+$. The difference may be alternatively referred to as a positive sequence quadrature current error. It should be noted the positive sequence quadrature reference current $i_q^{+*}$ is generated based on the error signal broadcasted by the RPA.

As shown in FIG. 4, the positive sequence quadrature current error is fed into a PI controller 187. The output of the PI controller 187 is generated based on the sum of the current error value and on an integral of the current error value. The output of the PI controller 187 is fed into a summing unit 188. As shown in FIG. 4, the summing unit 188 also receives a second cross-coupled signal.

The second cross-coupled signal received by the summing unit 188 is generated as follows. The positive sequence direct current $i_d^+$ is fed into a multiplier 184 where it is multiplied by $\omega L$. The output of the multiplier 184 is equal to $i_d^+ \times \omega L$. The output of the multiplier 184, as a second cross-coupled signal, is provided to the summing unit 188. The summing unit 188 generates a positive sequence quadrature reference voltage $V_q^{+*}$.

The outputs of the summing units 183 and 188 are positive sequence direct and quadrature reference voltages $V_d^{+*}$ and $V_q^{+*}$, respectively, which are fed into a transformation block 196 where the positive sequence direct and quadrature reference voltages are converted into the reference voltages in the abc system.

The negative sequence direct current processing branch 193 is similar to the positive sequence direct current processing branch 191, and hence is not discussed in detail. Likewise, the negative sequence quadrature current processing branch 194 is similar to the positive sequence quadrature current processing branch 192, and hence is not discussed in detail. As shown in FIG. 4, the outputs of the summing units are negative sequence direct and quadrature reference voltages $V_d^{-*}$ and $V_q^{-*}$, respectively, which are fed into a transformation block 198 where the negative sequence direct and quadrature reference voltages are converted into the reference voltages in the abc system.

The positive sequence and negative sequence reference voltages are combined at a summing unit 197 to provide a reference voltage signal $V_{abc}^{+*}$. The reference voltage signal $V_{abc}^{+*}$ is provided to a pulse width modulation (PWM) controller for generating on-off switching commands of the inverter. The PWM controller may be part of a digital signal processor (DSP).

Figure 5:
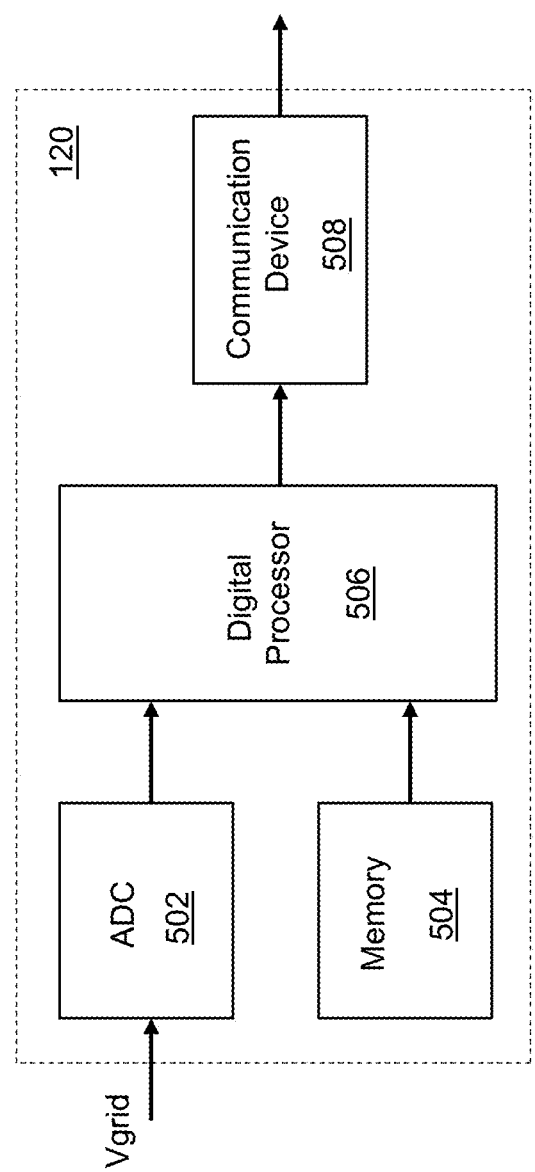
FIG. 5 illustrates a block diagram of the RPA controller shown in FIG. 1 in accordance with various embodiments of the present disclosure.

FIG. 5 illustrates a block diagram of the RPA controller shown in FIG. 1 in accordance with various embodiments of the present disclosure. As shown in FIG. 5, the RPA controller 120 includes an analog-to-digital converter 502, a memory 504, a digital processor 506 and a communication device 508. As shown in FIG. 5, the analog-to-digital converter 502 is configured to receive the voltage $V_{grid}$ and convert the voltage into a digital signal suitable for the digital processor 506. Control instructions are stored in the memory 504. The digital processor 506 loads the control instructions from the memory 504. The control instructions are executed in the digital processor 506 to process the digital signal from the analog-to-digital converter 502. After the digital signal has been processed, the digital processor 506 is configured to generate an error signal. The error signal comprises a first component and a second component. The first component comprises a value indicative of a magnitude boosting requirement of the distribution power network during a fault in the grid. The second component comprises a value indicative of a voltage imbalance of the distribution power network during the fault. The error signal is fed into the communication device 508. The communication device 508 is configured to broadcast the error signal to the DERs.

In some embodiments, the digital processor 506 is implemented as a high speed processor such as a DSP. The DSP allows digital control implementation of the control method shown in Equations (11) and (12). FIG. 5 shows the control method can be fully implemented in the digital processor. This is merely an example, which should not unduly limit the scope of the claims. One of ordinary skill in the art would recognize many variations, alternatives, and modifications. For example, the part of the control method may be implemented by any other suitable processing circuits such as logic circuits, analog circuits and the like.

Figure 6:
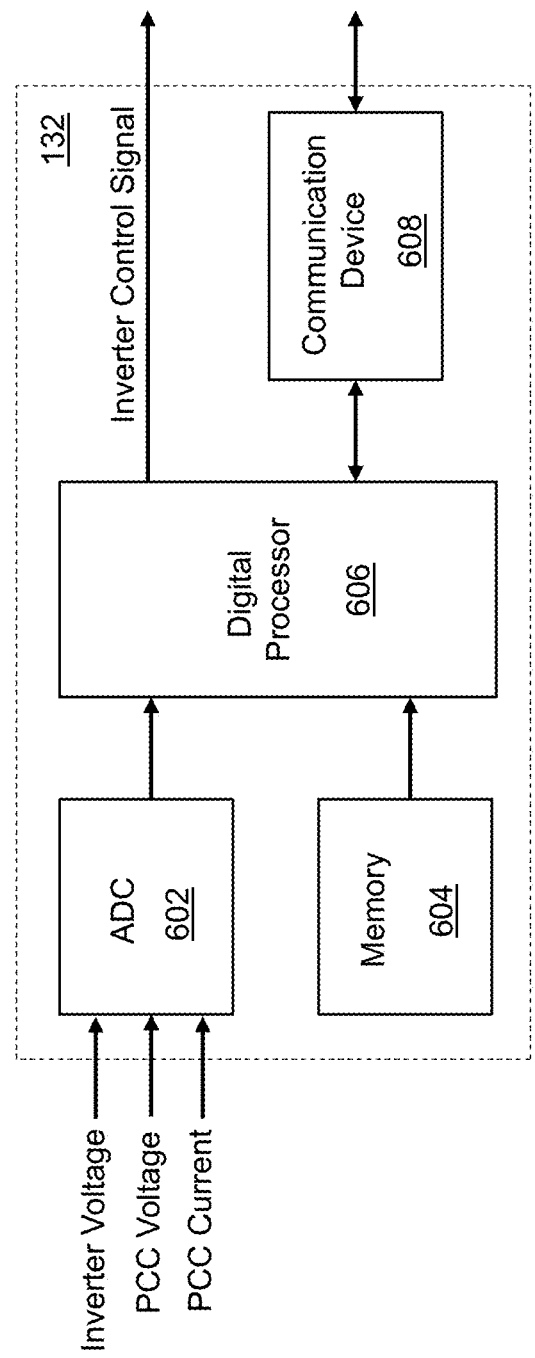
FIG. 6 illustrates a block diagram of the DER controller shown in FIG. 1 in accordance with various embodiments of the present disclosure.

FIG. 6 illustrates a block diagram of the DER controller shown in FIG. 1 in accordance with various embodiments of the present disclosure. As shown in FIG. 6, the DER controller 132 includes an analog-to-digital converter 602, a memory 604, a digital processor 606 and a communication device 608. As shown in FIG. 6, the analog-to-digital converter 602 is configured to receive a plurality of operating parameters including the output voltage of the inverter, the PCC voltage and the PCC current. The analog-to-digital converter 602 converts the operating parameters into digital signals suitable for the digital processor 606. The communication device 608 is configured to receive the error signal broadcasted by the RPA and feed the error signal into the digital processor 606.

Control instructions are stored in the memory 604. The digital processor 606 loads the control instructions from the memory 604. The control instructions are executed in the digital processor 606 to process the digital signals from the analog-to-digital converter 502 and the error signal from the communication device 608. After the digital signals and error signal have been processed, the digital processor 606 is configured to generate an inverter control signal. The inverter control signal is used to control the current injection from the DER associated with this DER controller.

Figure 7:
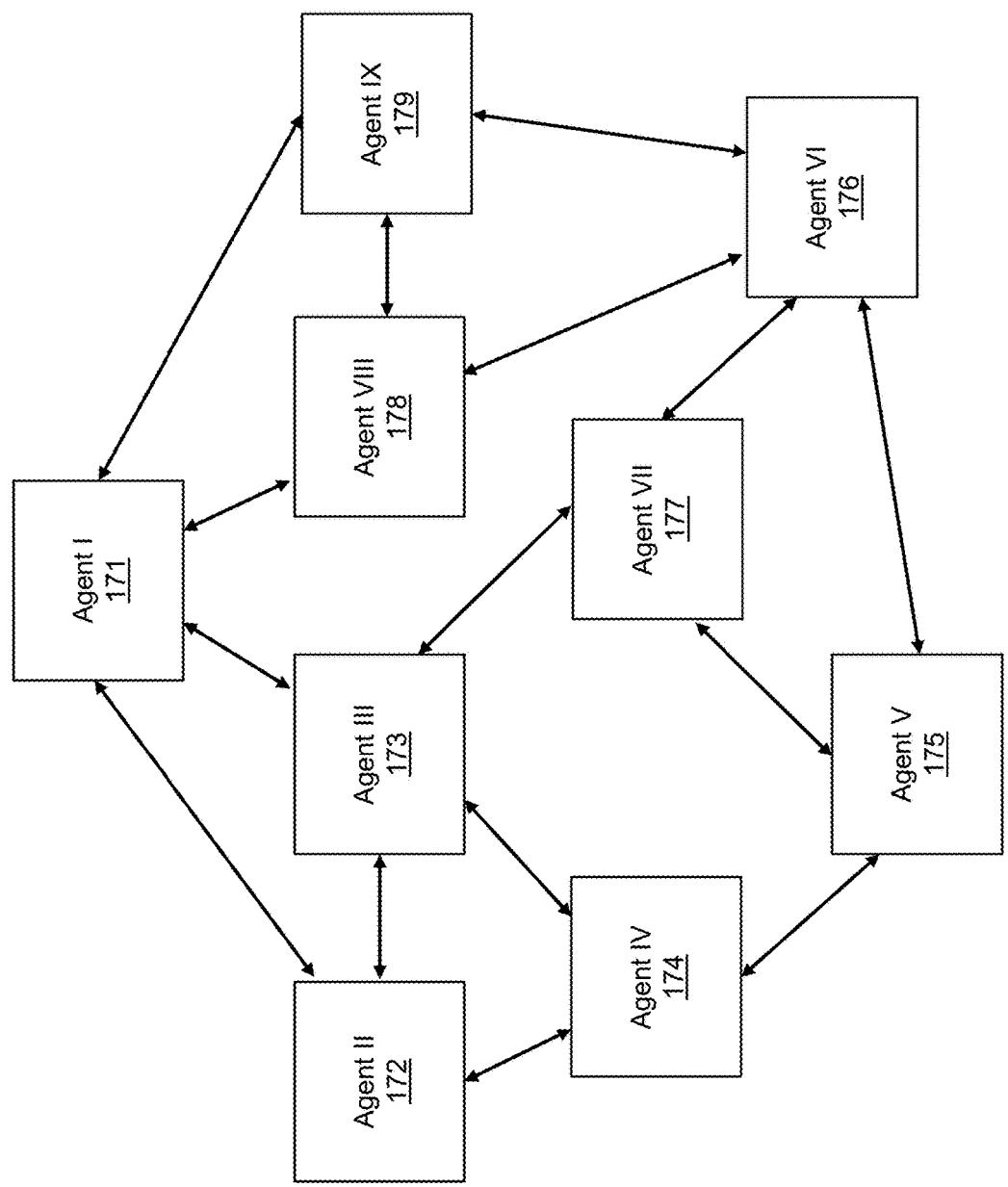
FIG. 7 illustrates a control system implementing a distributed cooperative dynamic voltage support control scheme in accordance with various embodiments of the present disclosure.

FIG. 7 illustrates a control system implementing a distributed cooperative dynamic voltage support (DCDVS) control scheme in accordance with various embodiments of the present disclosure. The distribution power network shown in FIG. 1 can be modelled as a multi-agent system as shown in FIG. 7. The RPA is a leading agent 171. The leading agent 171 may be alternatively referred to as an RPA agent or a leading RPA agent. The DERs are agents 172-179 coupled to the leading RPA agent 171.

In operation, the RPA (agent 171) broadcasts the error signal to DERs (e.g., agents 172, 173, 178 and 179) directly coupled to the RPA. The DERs directly coupled to the RPA forward the error signal DERs (e.g., agents 174, 175, 176 and 177) indirectly coupled to the RPA.

In operation, a distributed target tracking control scheme is applied to the plurality of DERs (agents 172-172). Applying the distributed target tracking control scheme comprises determining the currents to be injected under the distributed target tracking control scheme by having communications between the DERs (agents 172-172) to coordinate a current to be injected by each of the plurality of DERs.

The agents communicate with each other to achieve a global objective. The global objective for each of DER agents is to fulfil the requirement (e.g., the error signal) from the leading RPA agent 171. Each DER agent not only implements the local response characteristics, but also cooperates with other DER agents. This feature ensures agents to possesses local autonomy, while satisfying requests from the leading agent. The RPA (leading agent) can broadcast an event-based request (e.g., an error signal after a fault has occurred) to network agents (DERs) requesting them to provide an aggregated DCDVS support to achieve a certain response at the RPA. This request is a common interest for all network agents as connectivity of RPA is vital for rest of the agents to remain online.

The agents (agents 172-179) in FIG. 7 form a flock. In the flock, the agents have local interactions between individual agents and exhibit collective motion to achieve a global objective. The agents are capable of splitting, rejoining and forming a highly ordered fast convergence of center of mass towards the target. The agents (DERs) are able to reach a global objective broadcasted by the leading agent (RPA) while interacting locally with other neighboring DERs. Three control schemes are employed to control the behaviors of the agents.

A first control scheme is based on a velocity matching behavior of a flock. Agents try to adjust their speed with their neighbors (alignment). This behavior is helpful to avoid uncontrolled current injection, which might result in overvoltage.

A second control scheme is based on a flock centering behavior of a flock. Each agent attempts to remain near its neighbors (cohesion). This feature is helpful to keep voltage profile smooth and avoid large differences along the feeder.

A third control scheme is based on a collision avoidance behavior of a flock. Agents keep away from collision with their neighbors (separation). This behavior is not necessarily needed to be implemented in power systems domain as current injection of each DER can overlap.

In the present disclosure, the first control scheme and the second control scheme are employed to control the DERs.

Under the first control scheme, based on the error signal, the plurality of DERs is coordinated to inject currents into the distribution power network. Coordinating the plurality of DERs comprises aligning a current variation of one DER of the plurality of DERs with current variation of the remaining ones of the plurality of DERs. In some embodiments, the remaining ones of the plurality of DERs are the adjacent DERs. For example, the current variation of the DER (agent 174 shown in FIG. 7) is aligned with the current variations of the adjacent DERs (agents 172, 173 and 175).

Under the second control scheme, based on the error signal, the plurality of DERs is coordinated to inject currents into the distribution power network. Coordinating the plurality of DERs comprises aligning a voltage of one DER of the plurality of DERs with voltages of the remaining ones of the plurality of DERs.

The multi-agent system shown in FIG. 7 functions as a biological network. In this biological network, the most informed agent tends to modulate its information into their speed. For example, the most informed fish in a fish flock moves faster when it feels endangered. Agents need to pay more attention to fast-moving neighbors and assign larger weights to them. When the DCDVS control scheme is applied the multi-agent system, the behavior of the biological network can be modeled in two ways. A first approach is to link the acceleration behavior to the observed severity of a fault. If an agent is closer to the fault point, the acceleration of this agent would be faster. A second approach is whether an agent has a direct communication to the RPA and can access information with less noise unlike other agents learning the operation model from their neighbors.

Agents possess self-organization capability during and following a fault condition in a noisy communication environment. The constrained and local interactions among DERs include a global response pattern to ensure stability following the fault. The DERs can adjust the topology in real-time by adapting the weights associated with the links in response to the quality of the information received. The DERs do not need to converge to the same equilibrium. Instead, time and spatial diversity of the data across the network are exploited to permit nodes having some level of individuality in assessing and evaluating the quality of their data.

During a fault, a grid perturbation occurs. If the voltage level of the RPA transitions to a mandatory operation state (mandatory operating mode), the RPA broadcast the error signal including $\varepsilon_{unbalance}$ and $\varepsilon_{mag}$ values to the DERs across an unknown network. The DERs in the flock track the error signal to generate reference values for controlling the power converters associated with the DERs. In particular, the power converters inject currents based on respective reference values.

According to well-known distributed target tracking theory, each agent is related to an unknown target location. Agents cooperate via the well-known diffusion combine-then-adapt (CTA) strategy to track and estimate the unknown target location. Through this unknown location tracking method, the information can be directly received from the RPA or any other informed agent in the network.

If any of the agents receives a regulation signal such as the error signal, the DERs cooperate and generate incremental current injections locally over a time frame according to $\Delta v^{+,-} = \Delta i_Q^{+,-} \cdot t$ shown in Equation (11). Based on Equations (8.1), (8.2), (9.1) and (9.2), $\Delta i_Q$ can be represented as $I_{q_{pcc}}^+$ and $I_{q_{pcc}}^-$ current references. The current references $I_{q_{pcc}}^+$ and $I_{q_{pcc}}^-$ are used to determine the current injection velocity of an agent. The method above allows agents to match velocity of current injection to avoid unintentional voltage overshoots and smooth the voltage recovery.

Figure 8:
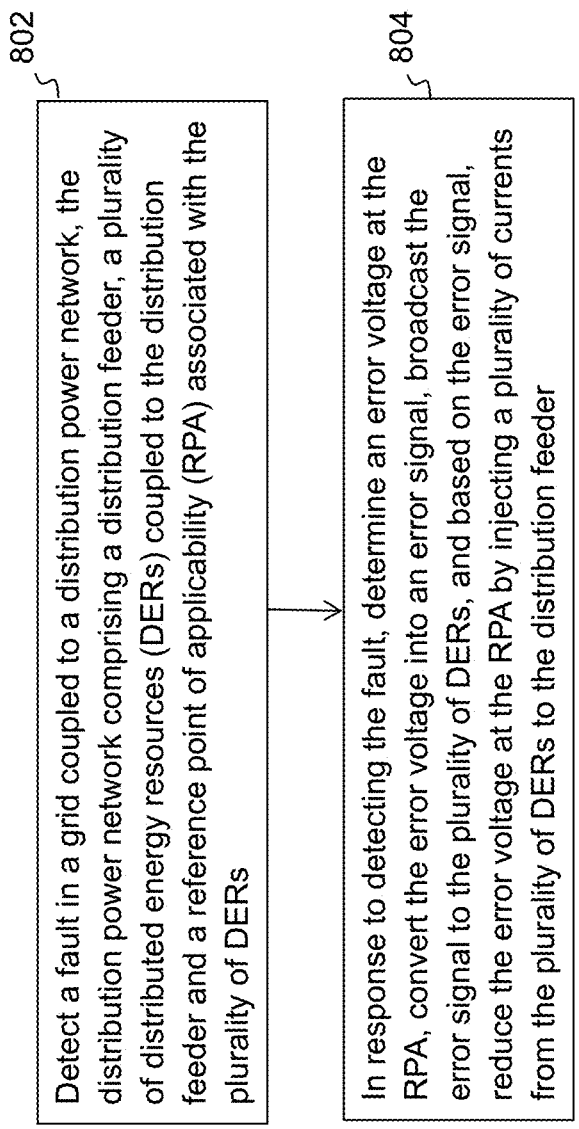
FIG. 8 illustrates a flow chart of a method for controlling the distribution power network shown in FIG. 1 in accordance with various embodiments of the present disclosure.

FIG. 8 illustrates a flow chart of a method for controlling the distribution power network shown in FIG. 1 in accordance with various embodiments of the present disclosure. This flowchart shown in FIG. 8 is merely an example, which should not unduly limit the scope of the claims. One of ordinary skill in the art would recognize many variations, alternatives, and modifications. For example, various steps illustrated in FIG. 8 may be added, removed, replaced, rearranged and repeated.

The distribution power network comprises a plurality of DERs coupled to a distribution feeder. The distributed power network is coupled to a grid. The power source of each DER is coupled to the distribution feeder through an inverter. The distribution power network further comprises a RPA. The RPA is a node adjacent to the interface between the grid and the distribution power network. When a fault occurs in the grid, the RPA is able to generate an error signal based on the detected voltage on the RPA node. The RPA is equipped with a RPA communication device. Each DER is equipped with a DER communication device. The RPA communication device is employed to broadcast the error signal to the plurality of DERs through the respective DER communication devices.

At step 802, a fault in a grid is detected by the RPA. The RPA is associated with the plurality of DERs. This is further described above in various embodiments, for example, in FIGS. 2-4.

At step 804, in response to detecting the fault, the RPA is configured to determine an error voltage, convert the error voltage into an error signal and broadcast the error signal to the plurality of DERs. Based on the error signal, a plurality of currents from the plurality of DERs is injected to the distribution feeder for reducing the error voltage at the RPA. This is further described above in various embodiments, for example, in FIGS. 2-4. One potentially advantageous feature of having step 804 is the DERs, based on the error signal, inject currents into the distribution feeder during the fault. The injected currents help to reduce the error voltage at the RPA, thereby maintaining a predetermined voltage profile at the RPA.

Figure 9:
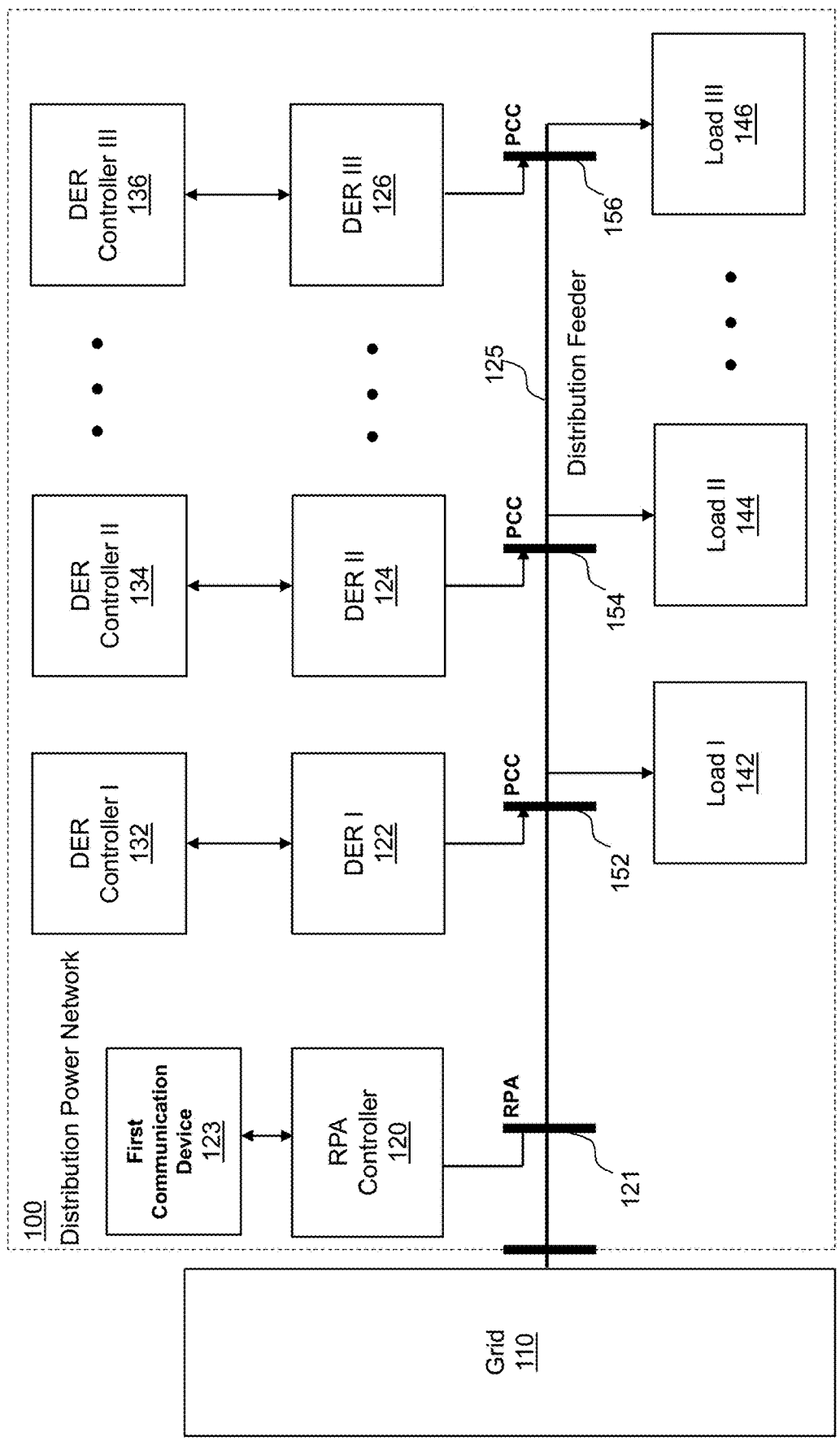
FIG. 9 illustrates a block diagram of a system in accordance with various embodiments of the present disclosure.

FIG. 9 illustrates a block diagram of a system in accordance with various embodiments of the present disclosure. A distribution power network 100 is coupled to a grid 110. The distribution power network 100 comprises a distribution feeder 125, a plurality of distributed energy resources (DERs) 122-126 coupled to the distribution feeder 125 and a reference point of applicability (RPA) 121 and a RPA controller 120 coupled to the RPA 121. The RPA controller 120 is configured, by a program, to detect a fault in the grid 11o as, for example, described with respect to FIG. 2. In response to detecting the fault, the RPA controller 120 is configured, by the program to determine an error voltage at the RPA 121 and convert the error voltage into an error signal as, for example, described with respect to FIG. 3. A first communication device 123 is coupled to the RPA controller 120 as, for example, described with respect to FIG. 5. The first communication device 123 is configured to broadcast the error signal to the plurality of DERs 122-126 as, for example, described with respect to FIG. 5. A plurality of DER controllers 132-136 is coupled to respective DERs of the plurality of DERs 122-126 as, for example, described with respect to FIG. 1. Based on the error signal, the plurality of DER controllers 132-136 is configured by programming to control the respective DERs to reduce the error voltage at the RPA 121 by injecting a plurality of currents to the distribution feeder 125 as, for example, described with respect to FIG. 1.

Figure 10:
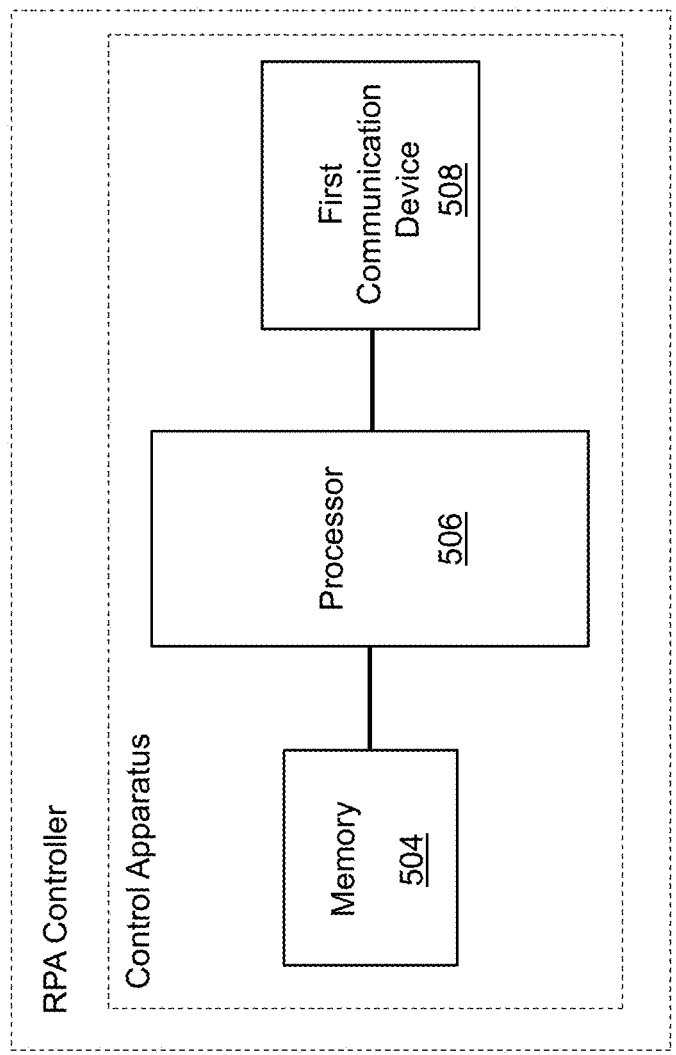
FIG. 10 illustrates a block diagram of a RPA controller in accordance with various embodiments of the present disclosure.

FIG. 10 illustrates a block diagram of a RPA controller in accordance with various embodiments of the present disclosure. The RPA controller comprises a control apparatus coupled to a distribution power network. The distribution power network comprises a distribution feeder, a plurality of distributed energy resources (DERs) coupled to the distribution feeder and a RPA. The control apparatus is directly coupled to the RPA. As shown in FIG. 10, the control apparatus comprises a memory 504 storing a program comprising instructions, a processor 506 coupled to the memory 504 and a first communication device 508 coupled to the processor 506. The processor 506 and the first communication device 508 are similar to the digital processor and the communication device shown in FIG. 5, respectively. The processor 506 is configured to execute the program. The instructions when executed cause the processor 506 to detect a fault in a grid coupled to the distribution power network as, for example, described with respect to FIG. 2. In response to detecting the fault, the processor 506 determines an error voltage at the RPA, convert the error voltage into an error signal and send the error signal to the first communication device 508 as, for example, described with respect to FIGS. 2-4. The first communication device 508 is configured to broadcast the error signal to the plurality of DERs as, for example, described with respect to FIGS. 5-6.

Figure 11:
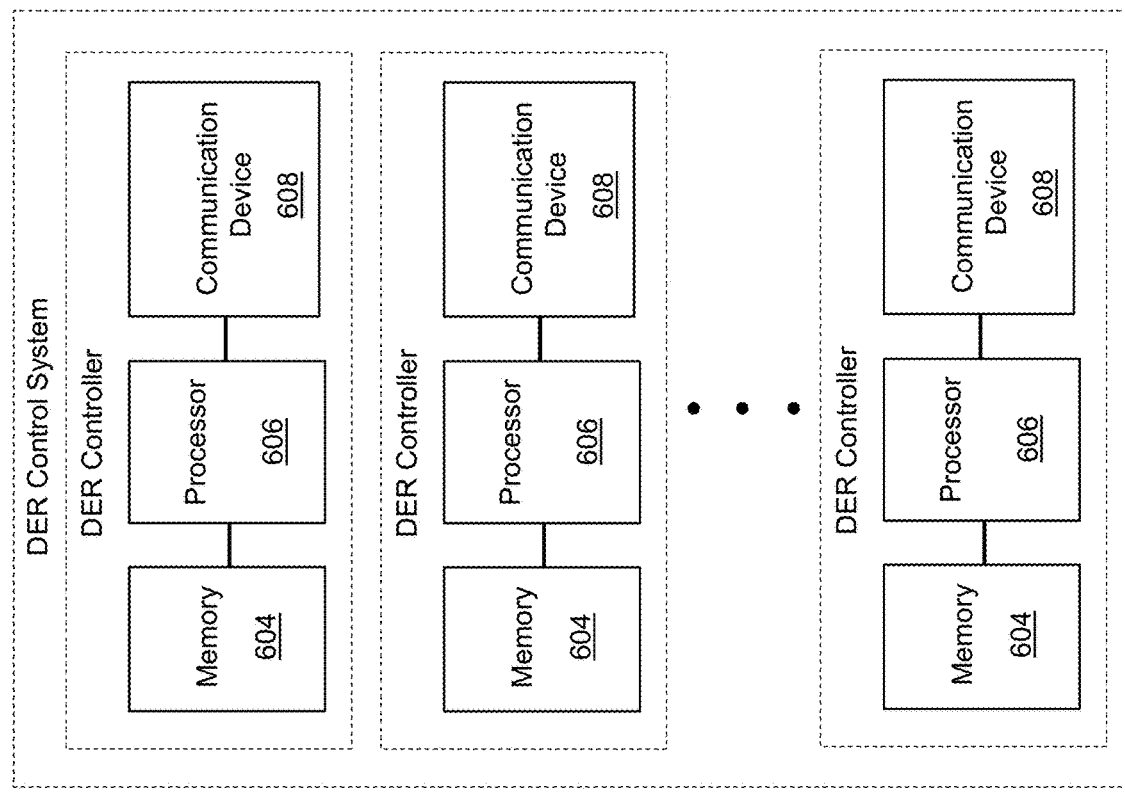
FIG. 11 illustrates a block diagram of a DER control system in accordance with various embodiments of the present disclosure.

FIG. 11 illustrates a block diagram of a DER control system in accordance with various embodiments of the present disclosure. The DER control system comprises a plurality of DER controllers as shown in FIG. 11. The plurality of DER controllers is coupled to a distribution power network comprising a distribution feeder, a plurality of DERs coupled to the distribution feeder and a RPA. Each of the plurality of DER controllers is coupled to a corresponding DER of the plurality of DERs. Each of the plurality of DER controllers comprises a memory 604 storing a program comprising instructions, a processor 606 coupled to the memory 604 and a communication device 608 coupled to the processor 606. The processor 606 is configured to execute the program. The instructions when executed in each of the plurality of DER controllers cause the plurality of DER controllers to receive an error signal from a RPA controller directly coupled to the RPA, and send control signals to the plurality of DERs as, for example, described with respect to FIGS. 2-4 and 7. One of the control signals is sent to one of the plurality of DERs. The control signals received by the plurality of DERs are configured to reduce an error voltage at the RPA by injecting a plurality of currents from the plurality of DERs to the distribution feeder as, for example, described with respect to FIGS. 1-4.

Figure 12:
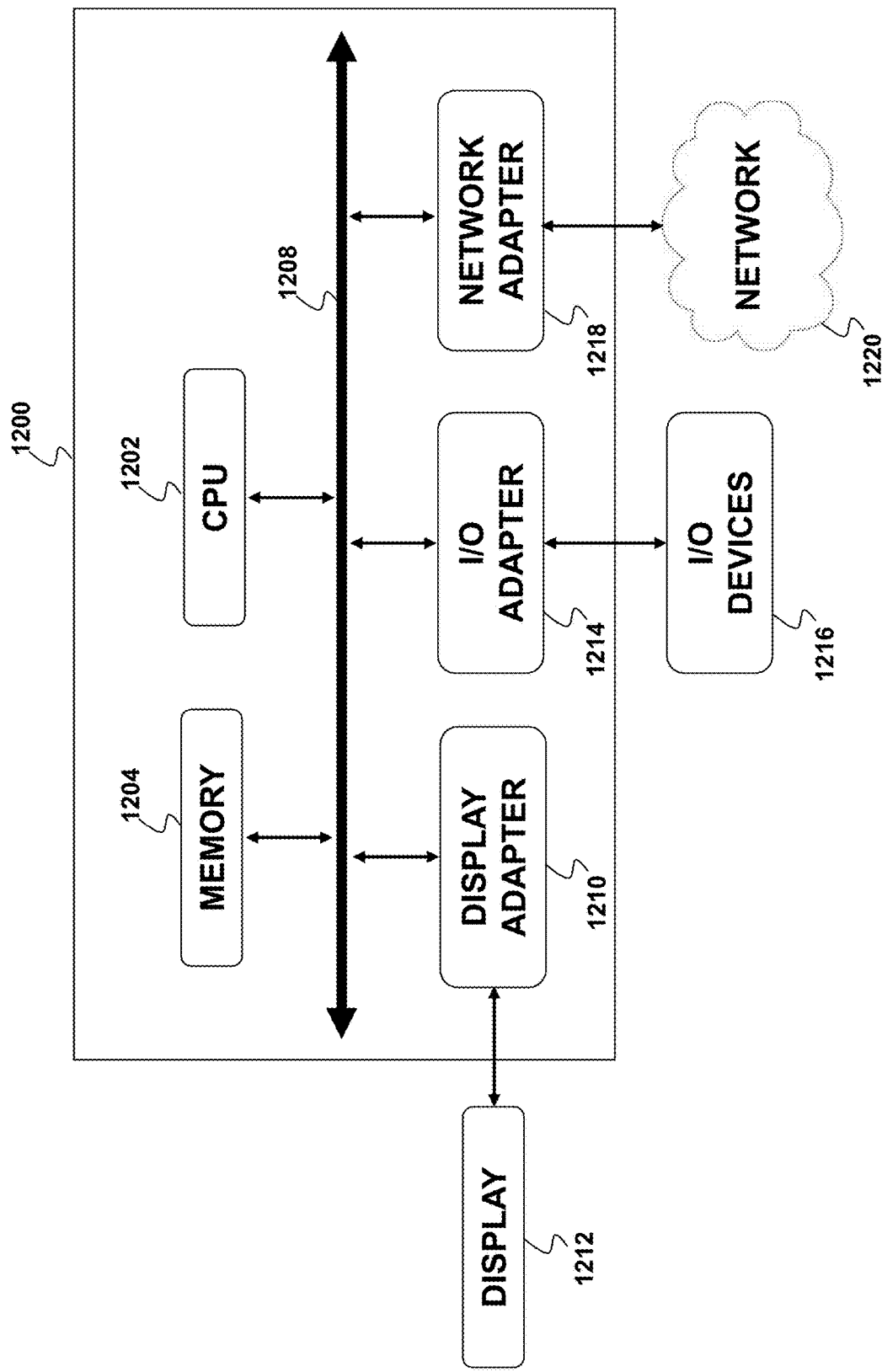
FIG. 12 illustrates a block diagram of a processing system in accordance with various embodiments of the present disclosure.

FIG. 12 illustrates a block diagram of a processing system in accordance with various embodiments of the present disclosure. The processing system 1200 depicts a general-purpose platform and the general components and functionality that may be used to implement portions of the embodiment distribution power network and/or an external computer or processing device interfaced to the embodiment distribution power network. For example, processing system 1200 may be used to implement a portion of the controller shown in FIG. 10. In some embodiments, processing system 1200 may be used to determine and evaluate embodiment operating parameters, as well as determine the error signal of the distribution power network based on the operating parameters.

Processing system 1200 may include, for example, a central processing unit (CPU) 1202, and memory 1204 connected to a bus 1208, and may be configured to perform the processes discussed above. The processing system 1200 may further include, if desired or needed, a display adapter 1210 to provide connectivity to a local display 1212 and an input-output (I/O) Adapter 1214 to provide an input/output interface for one or more input/output devices 1216, such as a mouse, a keyboard, flash drive or the like.

The processing system 1200 may also include a network interface 1218, which may be implemented using a network adaptor configured to be coupled to a wired link, such as a network cable, USB interface, or the like, and/or a wireless/cellular link for communications with a network 1220. The network interface 1218 may also comprise a suitable receiver and transmitter for wireless communications. It should be noted that the processing system 1200 may include other components. For example, the processing system 1200 may include hardware components power supplies, cables, a motherboard, removable storage media, cases, and the like if implemented externally. These other components, although not shown, are considered part of the processing system 1200. In some embodiments, processing system 1200 may be implemented on a single monolithic semiconductor integrated circuit and/or on the same monolithic semiconductor integrated circuit as other disclosed system components.

Example embodiments of the invention are summarized here. Other embodiments can also be understood from the entirety of the specification as well as the claims filed herein.

It may be advantageous to reduce an overshoot risk. To better address it, in Example 1 of the invention, a method is presented that includes detecting a fault in a grid coupled to a distribution power network, the distribution power network including a distribution feeder, a plurality of distributed energy resources (DERs) coupled to the distribution feeder and a reference point of applicability (RPA) associated with the plurality of DERs. The method includes, in response to detecting the fault, determining an error voltage at the RPA, converting the error voltage into an error signal, broadcasting the error signal to the plurality of DERs, and based on the error signal, reducing the error voltage at the RPA by injecting a plurality of currents from the plurality of DERs to the distribution feeder.

It may be advantageous to achieve a two-dimensional unbalanced voltage recovery objective based on separating positive sequence components of the error voltage from negative sequence components of the error voltage. To better address it, in Example 2 of the invention, the method of example 1, where converting the error voltage into the error signal includes, at the RPA, separating positive sequence components of the error voltage from negative sequence components of the error voltage; and at the RPA, generating the error signal including a first component based on the positive sequence components, and a second component based on both the positive sequence components and the negative sequence components.

It may be advantageous to achieve a coordinated positive sequence current injection for voltage magnitude boosting and a coordinated negative sequence current injection for unbalance voltage mitigation. To better address it, in Example 3 of the invention, the method of one of examples 1 or 2, where: the first component includes a value indicative of a magnitude boosting requirement of the distribution power network during the fault; and the second component includes a value indicative of a voltage imbalance of the distribution power network during the fault.

Example 4. The method of one of examples 1 to 3, where reducing the error voltage at the RPA includes: based on the first component, boosting a voltage of the distribution power network by applying a positive sequence current injection control scheme to the plurality of DERs.

Example 5. The method of one of examples 1 to 4, where reducing the error voltage at the RPA includes: based on the second component, mitigating unbalanced voltages of the distribution power network by applying a negative sequence current injection control scheme to the plurality of DERs.

It may be advantageous to reduce the possibility of introducing the overvoltage at the non-faulted phases through mitigating the unbalanced voltages of the non-faulted phases. To better address it, in Example 6 of the invention, the method of one of examples 1 to 5, where detecting the fault in the grid includes detecting: an unbalanced fault in at least one phase of three phases of the grid, and where reducing the error voltage at the RPA includes determining the plurality of currents to be injected by applying a dynamic voltage support (DVS) control scheme to the plurality of DERs, and where applying the DVS control scheme includes, by injecting the plurality of currents to the distribution feeder, boosting voltages of faulted phases of the plurality of DERs and mitigating unbalanced voltages of non-faulted phases of the plurality of DERs.

Example 7. The method of one of examples 1 to 6, where the faulted phases and the non-faulted phases of the plurality of DERs are configured to operate in modes including, in particular consisting of, a continuous operating mode, a mandatory operating mode, a momentary cessation mode and a trip mode, where boosting the voltages of the faulted phases of the plurality of DERs includes forcing the faulted phases to leave the momentary cessation mode and enter into the mandatory operating mode, and where mitigating the unbalanced voltages of the non-faulted phases of the plurality of DERs includes forcing the non-faulted phases to leave the mandatory operating mode and enter into the continuous operating mode.

Example 8. The method of one of examples 1 to 7, further including: through boosting the voltages of the faulted phases of the plurality of DERs and mitigating the unbalanced voltages of the non-faulted phases of the plurality of DERs, preventing the faulted phases and the non-faulted phases of the plurality of DERs from entering into the trip mode.

It may be an advantageous feature that, through the alignment of the current variations, the DERs can be coordinated to avoid uncoordinated current injections. To better address it, in Example 9 of the invention, the method of one of examples 1 to 8, where reducing the error voltage at the RPA includes: based on the error signal, coordinating the plurality of DERs to inject currents into the distribution power network, and where coordinating the plurality of DERs includes, e.g., by a velocity matching algorithm and/or the first control scheme as described above, aligning a current variation of one DER of the plurality of DERs with current variation of the remaining ones of the plurality of DERs.

It may be an advantageous feature that, through the alignment of the voltages of the DERs, the DERs can be coordinated to support the RPA voltage profile. To better address it, in Example 10 of the invention, the method of one of examples 1 to 9, where reducing the error voltage at the RPA includes: based on the error signal, coordinating the plurality of DERs to inject currents into the distribution power network, and where coordinating the plurality of DERs includes, e.g., by a velocity matching algorithm and/or the second control scheme as described above, aligning a voltage of one DER of the plurality of DERs with voltages of the remaining ones of the plurality of DERs.

It may be an advantageous feature that, through the broadcasting mechanism below, all DERs can reliably receive the error signal from the RPA. To better address it, in Example 11 of the invention, the method of one of examples 1 to 10, where broadcasting the error signal to the plurality of DERs includes: broadcasting the error signal to first DERs of the plurality of DERs, the first DERs being directly coupled to the RPA, and forwarding the error signal from the first DERs to second DERs of the plurality of DERs, the second DERs being indirectly coupled to the RPA.

It may be an advantageous feature that the DERs, under the distributed target tracking control scheme, can support the RPA voltage profile during and after the fault ridge through and avoid uncoordinated current injections through a cooperative behavior. To better address it, in Example 12 of the invention, the method of one of examples 1 to 11, where reducing the error voltage at the RPA includes: applying a distributed target tracking control scheme to the plurality of DERs, and where applying the distributed target tracking control scheme includes determining the plurality of currents to be injected under the distributed target tracking control scheme by having communications between the plurality of DERs to coordinate a current to be injected by each of the plurality of DERs.

It may be advantageous to reduce an overshoot risk. To better address it, in Example 13 of the invention, a system is presented that includes a distribution power network coupled to a grid, the distribution power network including a distribution feeder, a plurality of distributed energy resources (DERs) coupled to the distribution feeder and a reference point of applicability (RPA); a RPA controller coupled to the RPA, where the RPA controller is configured, by a program, to detect a fault in the grid, and in response to detecting the fault, determine an error voltage at the RPA and convert the error voltage into an error signal; a first communication device coupled to the RPA controller, the first communication device being configured to broadcast the error signal to the plurality of DERs. The system includes a plurality of DER controllers coupled to respective DERs of the plurality of DERs, where based on the error signal, the plurality of DER controllers is configured by programming to control the respective DERs to reduce the error voltage at the RPA by injecting a plurality of currents to the distribution feeder.

Example 14. The system of example 13, where the RPA controller is configured by the program to separate positive sequence components of the error voltage from negative sequence components of the error voltage, and generate the error signal including a first component based on the positive sequence components, and a second component based on both the positive sequence components and the negative sequence components, and where: the first component includes a value indicative of a magnitude boosting requirement of the distribution power network during the fault; and the second component includes a value indicative of a voltage imbalance of the distribution power network during the fault.

Example 15. The system of one of examples 13 or 14, where based on the first component, the plurality of DER controllers is configured by the programming to boost a voltage of the distribution power network by applying a positive sequence current injection control scheme to the plurality of DERs; and based on the second component, the plurality of DER controllers is configured by the programming to mitigate unbalanced voltages of the distribution power network by applying a negative sequence current injection control scheme to the plurality of DERs.

Example 16. The system of one of examples 13 to 15, where: the plurality of DER controllers is configured by the programming to control the plurality of DERs to boost voltages of faulted phases of the plurality of DERs, and mitigate unbalanced voltages of non-faulted phases of the plurality of DERs.

Example 17. The system of one of examples 13 to 16, where: the plurality of DER controllers is configured by the programming to coordinate the plurality of DERs to inject currents into the distribution power network through, e.g., by a velocity matching algorithm and/or the first control scheme as described above, aligning a current variation of one DER of the plurality of DERs with current variations of the remaining ones of the plurality of DERs.

Example 18. The system of one of examples 13 to 17, where: the plurality of DER controllers is configured by the programming to coordinate the plurality of DERs to inject currents into the distribution power network through, e.g. by a flock-centering algorithm and/or the second control scheme as described above, aligning a voltage of one DER of the plurality of DERs with voltages of the remaining ones of the plurality of DERs.

Example 19. The system of one of examples 13 to 18, further including: a second communication device coupled to a first DER of the plurality of DERs, where the first DER is directly coupled to the RPA; and a third communication device coupled to a second DER of the plurality of DERs, where the second DER is indirectly coupled to the RPA, and where the second communication device is configured to receive the error signal broadcasted by the first communication device, and forward the error signal to the third communication device.

Example 20. The system of one of examples 13 to 19, further including: a plurality of inverters, where one of the plurality of inverters is coupled between each of the plurality of DERs and the distribution feeder, and where based on the error signal, the plurality of inverters is configured to generate the plurality of currents to be injected to the distribution feeder.

It may be advantageous to reduce an overshoot risk. To better address it, in Example 21 of the invention, a system reference point of applicability (RPA) controller is presented that includes: a control apparatus coupled to a distribution power network including a distribution feeder, a plurality of distributed energy resources (DERs) coupled to the distribution feeder and a RPA, where the control apparatus is directly coupled to the RPA, the control apparatus including: a memory storing a program including instructions; a processor coupled to the memory and configured to execute the program; and a first communication device coupled to the processor, where the instructions when executed cause the processor to detect a fault in a grid coupled to the distribution power network, and in response to detecting the fault, determine an error voltage at the RPA, convert the error voltage into an error signal and send the error signal to the first communication device, and where the first communication device is configured to broadcast the error signal to the plurality of DERs.

Example 22. The RPA controller of example 21, where: a first DER of the plurality of DERs is coupled to a second communication device, the first DER being directly coupled to the RPA; a second DER of the plurality of DERs is coupled to a third communication device, the second DER being indirectly coupled to the RPA, and where the second communication device is configured to receive the error signal broadcasted by the first communication device, and forward the error signal to the third communication device; and the plurality of DERs is coupled to a plurality of DER controllers, where based on the error signal, the plurality of DER controllers is configured by programming to control respective DERs to reduce the error voltage at the RPA by injecting a plurality of currents to the distribution feeder.

Example 23. The RPA controller of one of examples 21 or 22, where: the processor is configured by the program to separate positive sequence components of the error voltage from negative sequence components of the error voltage, and generate the error signal including a first component based on the positive sequence components, and a second component based on both the positive sequence components and the negative sequence components, and where: the first component includes a value indicative of a magnitude boosting requirement of the distribution power network during the fault; and the second component includes a value indicative of a voltage imbalance of the distribution power network during the fault.

It may be advantageous to reduce an overshoot risk. To better address it, in Example 24 of the invention, a distributed energy resources (DER) control system is presented that includes: a plurality of DER controllers coupled to a distribution power network including a distribution feeder, a plurality of distributed energy resources (DERs) coupled to the distribution feeder and a reference point of applicability (RPA), where each of the plurality of DER controllers is coupled to a corresponding DER of the plurality of DERs, each of the plurality of DER controllers including a memory storing a program including instructions, a processor coupled to the memory and configured to execute the program, and a communication device coupled to the processor, and where the instructions when executed in each of the plurality of DER controllers cause the plurality of DER controllers to receive an error signal from a RPA controller directly coupled to the RPA, send control signals to the plurality of DERs, one of the control signals being sent to one of the plurality of DERs, and where the control signals received by the plurality of DERs are configured to reduce an error voltage at the RPA by injecting a plurality of currents from the plurality of DERs to the distribution feeder.

Example 25. The DER control system of example 24, where the error voltage includes positive sequence components and negative sequence components, and the error signal includes a first component based on the positive sequence components, and a second component based on both the positive sequence components and the negative sequence components, and where: the first component includes a value indicative of a magnitude boosting requirement of the distribution power network during a fault in a grid coupled to the distribution power network; and the second component includes a value indicative of a voltage imbalance of the distribution power network during the fault.

Example 26. The DER control system of one of examples 24 or 25, where: based on the first component, the plurality of DER controllers is configured by executing the instructions in each of the plurality of DER controllers to boost a voltage of the distribution power network by applying a positive sequence current injection control scheme to the plurality of DERs; and based on the second component, the plurality of DER controllers is configured by executing the instructions in each of the plurality of DER controllers to mitigate unbalanced voltages of the distribution power network by applying a negative sequence current injection control scheme to the plurality of DERs.

Example 27. The DER control system of one of examples 24 to 26, where: the plurality of DER controllers is configured by executing the instructions in each of the plurality of DER controllers to coordinate the plurality of DERs to inject currents into the distribution power network through, e.g., by a velocity matching algorithm and/or the first control scheme as described above, aligning a current variation of one DER of the plurality of DERs with current variations of the remaining ones of the plurality of DERs; and the plurality of DER controllers is configured by executing the instructions in each of the plurality of DER controllers to coordinate the plurality of DERs to inject currents into the distribution power network through, e.g., by a flock-centering algorithm and/or the second control scheme as described above, aligning a voltage of one DER of the plurality of DERs with voltages of the remaining ones of the plurality of DERs.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
    detecting a fault in a grid coupled to a distribution power network, the distribution power network comprising a distribution feeder, a plurality of distributed energy resources (DERs) coupled to the distribution feeder and a reference point of applicability (RPA) associated with the plurality of DERs; and
    in response to detecting the fault, determining an error voltage at the RPA, converting the error voltage into an error signal, broadcasting the error signal to the plurality of DERs, and based on the error signal, reducing the error voltage at the RPA by injecting a plurality of currents from the plurality of DERs to the distribution feeder.

2. The method of claim 1, wherein converting the error voltage into the error signal comprises:
    at the RPA, separating positive sequence components of the error voltage from negative sequence components of the error voltage; and
    at the RPA, generating the error signal comprising a first component based on the positive sequence components, and a second component based on both the positive sequence components and the negative sequence components.

3. The method of claim 2, wherein:
    the first component comprises a value indicative of a magnitude boosting requirement of the distribution power network during the fault; and
    the second component comprises a value indicative of a voltage imbalance of the distribution power network during the fault.

4. The method of claim 3, wherein reducing the error voltage at the RPA comprises at least one of:
    based on the first component, boosting a voltage of the distribution power network by applying a positive sequence current injection control scheme to the plurality of DERs; and
    based on the second component, mitigating unbalanced voltages of the distribution power network by applying a negative sequence current injection control scheme to the plurality of DERs.

5. The method of claim 1, wherein detecting the fault in the grid comprises detecting:
    an unbalanced fault in at least one phase of three phases of the grid, and wherein reducing the error voltage at the RPA comprises determining the plurality of currents to be injected by applying a dynamic voltage support (DVS) control scheme to the plurality of DERs, and wherein applying the DVS control scheme comprises, by injecting the plurality of currents to the distribution feeder, boosting voltages of faulted phases of the plurality of DERs and mitigating unbalanced voltages of non-faulted phases of the plurality of DERs.

6. The method of claim 5,
    wherein the faulted phases and the non-faulted phases of the plurality of DERs are configured to operate in modes comprising a continuous operating mode, a mandatory operating mode, a momentary cessation mode and a trip mode,
    wherein boosting the voltages of the faulted phases of the plurality of DERs comprises forcing the faulted phases to leave the momentary cessation mode and enter into the mandatory operating mode, and
    wherein mitigating the unbalanced voltages of the non-faulted phases of the plurality of DERs comprises forcing the non-faulted phases to leave the mandatory operating mode and enter into the continuous operating mode.

7. The method of claim 6, further comprising:
    through boosting the voltages of the faulted phases of the plurality of DERs and mitigating the unbalanced voltages of the non-faulted phases of the plurality of DERs, preventing the faulted phases and the non-faulted phases of the plurality of DERs from entering into the trip mode.

8. The method of claim 1, wherein reducing the error voltage at the RPA comprises at least one of:
    based on the error signal, coordinating the plurality of DERs to inject currents into the distribution power network, and wherein coordinating the plurality of DERs comprises aligning a current variation of one DER of the plurality of DERs with current variations of the remaining ones of the plurality of DERs;
    based on the error signal, coordinating the plurality of DERs to inject currents into the distribution power network, and wherein coordinating the plurality of DERs comprises aligning a voltage of one DER of the plurality of DERs with voltages of the remaining ones of the plurality of DERs; and
    applying a distributed target tracking control scheme to the plurality of DERs, and wherein applying the distributed target tracking control scheme comprises determining the plurality of currents to be injected under the distributed target tracking control scheme by having communications between the plurality of DERs to coordinate a current to be injected by each of the plurality of DERs.

9. The method of claim 1, wherein broadcasting the error signal to the plurality of DERs comprises:
broadcasting the error signal to first DERs of the plurality of DERs, the first DERs being directly coupled to the RPA, and forwarding the error signal from the first DERs to second DERs of the plurality of DERs, the second DERs being indirectly coupled to the RPA.

10. A system comprising:
a distribution power network coupled to a grid, the distribution power network comprising a distribution feeder, a plurality of distributed energy resources (DERs) coupled to the distribution feeder and a reference point of applicability (RPA);
a RPA controller coupled to the RPA, the RPA controller being configured, by a program, to detect a fault in the grid, and
in response to detecting the fault, determine an error voltage at the RPA and convert the error voltage into an error signal;
a first communication device coupled to the RPA controller, the first communication device being configured to broadcast the error signal to the plurality of DERs; and
a plurality of DER controllers coupled to respective DERs of the plurality of DERs, wherein based on the error signal, the plurality of DER controllers is configured by programming to control the respective DERs to reduce the error voltage at the RPA by injecting a plurality of currents to the distribution feeder.

11. The system of claim 10, wherein:
the RPA controller is configured by the program to separate positive sequence components of the error voltage from negative sequence components of the error voltage, and generate the error signal comprising a first component based on the positive sequence components, and a second component based on both the positive sequence components and the negative sequence components, and wherein:
the first component comprises a value indicative of a magnitude boosting requirement of the distribution power network during the fault; and
the second component comprises a value indicative of a voltage imbalance of the distribution power network during the fault.

12. The system of claim 11, wherein:
based on the first component, the plurality of DER controllers is configured by the programming to boost a voltage of the distribution power network by applying a positive sequence current injection control scheme to the plurality of DERs; and
based on the second component, the plurality of DER controllers is configured by the programming to mitigate unbalanced voltages of the distribution power network by applying a negative sequence current injection control scheme to the plurality of DERs.

13. The system of claim 10, wherein:
the plurality of DER controllers is configured by the programming to control the plurality of DERs to boost voltages of faulted phases of the plurality of DERs, and mitigate unbalanced voltages of non-faulted phases of the plurality of DERs.

14. The system of claim 10, wherein the plurality of DER controllers is configured by the programming to control the respective DERs to reduce the error voltage at the RPA by injecting the plurality of currents to the distribution feeder through at least one of:
the plurality of DER controllers is configured by the programming to coordinate the plurality of DERs to inject currents into the distribution power network through aligning a current variation of one DER of the plurality of DERs with current variations of the remaining ones of the plurality of DERs; and
the plurality of DER controllers is configured by the programming to coordinate the plurality of DERs to inject currents into the distribution power network through aligning a voltage of one DER of the plurality of DERs with voltages of the remaining ones of the plurality of DERs.

15. The system of claim 10, further comprising:
a second communication device coupled to a first DER of the plurality of DERs, wherein the first DER is directly coupled to the RPA; and
a third communication device coupled to a second DER of the plurality of DERs, wherein the second DER is indirectly coupled to the RPA, and wherein the second communication device is configured to receive the error signal broadcasted by the first communication device, and forward the error signal to the third communication device.

16. The system of claim 10, further comprising:
a plurality of inverters, wherein one of the plurality of inverters is coupled between each of the plurality of DERs and the distribution feeder, and wherein based on the error signal, the plurality of inverters is configured to generate the plurality of currents to be injected to the distribution feeder.

17. A reference point of applicability (RPA) controller comprising:
a control apparatus coupled to a distribution power network comprising a distribution feeder, a plurality of distributed energy resources (DERs) coupled to the distribution feeder and a RPA, wherein the control apparatus is directly coupled to the RPA, the control apparatus comprising:
a memory storing a program comprising instructions;
a processor coupled to the memory and configured to execute the program; and
a first communication device coupled to the processor, wherein the instructions when executed cause the processor to detect a fault in a grid coupled to the distribution power network, and in response to detecting the fault, determine an error voltage at the RPA, convert the error voltage into an error signal and send the error signal to the first communication device, and wherein the first communication device is configured to broadcast the error signal to the plurality of DERs.

18. The RPA controller of claim 17, wherein:
a first DER of the plurality of DERs is coupled to a second communication device, the first DER being directly coupled to the RPA;
a second DER of the plurality of DERs is coupled to a third communication device, the second DER being indirectly coupled to the RPA, and wherein the second communication device is configured to receive the error signal broadcasted by the first communication device, and forward the error signal to the third communication device; and
the plurality of DERs is coupled to a plurality of DER controllers, wherein based on the error signal, the plurality of DER controllers is configured by programming to control respective DERs to reduce the error voltage at the RPA by injecting a plurality of currents to the distribution feeder.

19. The RPA controller of claim 17, wherein:
the processor is configured by the program to separate positive sequence components of the error voltage from negative sequence components of the error voltage, and generate the error signal comprising a first component based on the positive sequence components, and a second component based on both the positive sequence components and the negative sequence components, and wherein:
the first component comprises a value indicative of a magnitude boosting requirement of the distribution power network during the fault; and
the second component comprises a value indicative of a voltage imbalance of the distribution power network during the fault.

20. A distributed energy resources (DER) control system comprising:
a plurality of DER controllers coupled to a distribution power network comprising a distribution feeder, a plurality of distributed energy resources (DERs) coupled to the distribution feeder and a reference point of applicability (RPA), wherein each of the plurality of DER controllers is coupled to a corresponding DER of the plurality of DERs, each of the plurality of DER controllers comprising
a memory storing a program comprising instructions,
a processor coupled to the memory and configured to execute the program, and
a communication device coupled to the processor, and wherein the instructions when executed in each of the plurality of DER controllers cause the plurality of DER controllers to receive an error signal from a RPA controller directly coupled to the RPA, send control signals to the plurality of DERs, one of the control signals being sent to one of the plurality of DERs, and wherein the control signals received by the plurality of DERs are configured to reduce an error voltage at the RPA by injecting a plurality of currents from the plurality of DERs to the distribution feeder.

21. The DER control system of claim 20, wherein the error voltage comprises positive sequence components and negative sequence components, and the error signal comprises a first component based on the positive sequence components, and a second component based on both the positive sequence components and the negative sequence components, and wherein:
the first component comprises a value indicative of a magnitude boosting requirement of the distribution power network during a fault in a grid coupled to the distribution power network; and
the second component comprises a value indicative of a voltage imbalance of the distribution power network during the fault.

22. The DER control system of claim 21, wherein the control signals received by the plurality of DERs are configured to reduce the error voltage at the RPA by injecting the plurality of currents from the plurality of DERs to the distribution feeder through at least one of:
based on the first component, the plurality of DER controllers is configured by executing the instructions in each of the plurality of DER controllers to boost a voltage of the distribution power network by applying a positive sequence current injection control scheme to the plurality of DERs; and
based on the second component, the plurality of DER controllers is configured by executing the instructions in each of the plurality of DER controllers to mitigate unbalanced voltages of the distribution power network by applying a negative sequence current injection control scheme to the plurality of DERs.

23. The DER control system of claim 20, wherein the control signals received by the plurality of DERs are configured to reduce the error voltage at the RPA by injecting the plurality of currents from the plurality of DERs to the distribution feeder through at least one of:
the plurality of DER controllers is configured by executing the instructions in each of the plurality of DER controllers to coordinate the plurality of DERs to inject currents into the distribution power network through aligning a current variation of one DER of the plurality of DERs with current variations of the remaining ones of the plurality of DERs; and
the plurality of DER controllers is configured by executing the instructions in each of the plurality of DER controllers to coordinate the plurality of DERs to inject currents into the distribution power network through aligning a voltage of one DER of the plurality of DERs with voltages of the remaining ones of the plurality of DERs.

* * * * *